United States Patent [19]

Fukazawa

[11] Patent Number: 5,469,159
[45] Date of Patent: Nov. 21, 1995

[54] METHOD CAPABLE OF JUDGING VALIDITY OR INVALIDITY OF A STATUS OF SWITCHING ELEMENTS IN A KEYBOARD SWITCH DEVICE

[75] Inventor: Makoto Fukazawa, Chofu, Japan

[73] Assignee: Mitsumi Electric Co., Ltd., Tokyo, Japan

[21] Appl. No.: 896,104

[22] Filed: Jun. 9, 1992

[30]     Foreign Application Priority Data

Sep. 9, 1991   [JP]   Japan ................. 3-255931

[51] Int. Cl.$^6$ ............................................ H04B 15/00
[52] U.S. Cl. ........................................ 341/22; 341/24
[58] Field of Search ............................. 341/22, 24, 25, 341/26

[56]             References Cited

U.S. PATENT DOCUMENTS

| | | | |
|---|---|---|---|
| 4,420,744 | 12/1983 | Jesson | 340/365 E |
| 4,821,033 | 4/1989 | Mori et al. | 341/24 X |
| 4,922,248 | 5/1990 | Shiga | 341/24 X |
| 4,929,944 | 5/1990 | Nakajima | 341/24 |
| 5,059,974 | 10/1991 | Wu | 341/24 X |
| 5,220,323 | 6/1993 | Ito et al. | 341/24 |

FOREIGN PATENT DOCUMENTS 61-99220   5/1986   Japan .

*Primary Examiner*—John K. Peng
*Assistant Examiner*—Thomas J. Mullen, Jr.
*Attorney, Agent, or Firm*—Frishauf, Holtz, Goodman & Woodward

[57]             ABSTRACT

A method of detecting the status of a keyboard switch device judges validity or invalidity of the status of switching elements on the basis of simple conditions. With this method, processing of output data is facilitated. In a step S1, a scanning operation is carried out to detect the status of each switching element. In a step S2, the result of the scanning operation is stored in a memory unit as memorized information. In a step S3, closed element total number N, a closed row total number Nr, and a closed column total number Nc are counted with reference to the memorized information. In a step S4, a judgement is made as regards whether or not a predetermined condition is satisfied by the closed element total number N, the closed row total number Nr, and the closed column total number Nc. When the predetermined condition is satisfied, the memorized information is provided as valid data in a step S5. When the predetermined condition is not satisfied, the entirety of the memorized information is cancelled in a step S6.

16 Claims, 36 Drawing Sheets

FIG.5 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    |    |    |    |    |    |    |    |    |    |    |    |    |    |    |    |
| D2 |    |    |    |    |    |    |    |    |    |    |    |    |    |    |    |    |
| D3 |    |    |    |    |    |    |    | 0  |    |    | 0  |    |    |    |    |    |
| D4 |    |    |    |    |    |    |    |    |    |    |    |    |    |    |    |    |
| D5 |    |    |    |    |    |    |    |    |    |    |    |    |    |    |    |    |
| D6 |    |    |    |    |    |    |    | 0  |    |    | 0  |    |    |    |    |    |
| D7 |    |    |    |    |    |    |    |    |    |    |    |    |    |    |    |    |
| D8 |    |    |    |    |    |    |    |    |    |    |    |    |    |    |    |    |

FIG.5 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    |    |    |    |    |    |    |    |    |    |    |    |    |    |    |    |
| D2 |    |    |    | 0  |    | 0  |    | 0  |    | 0  |    |    |    |    |    |    |
| D3 |    |    |    |    |    |    |    |    |    |    |    |    |    |    | 0  |    |
| D4 |    |    |    |    |    |    |    |    |    |    |    |    |    |    |    |    |
| D5 |    |    |    |    |    |    |    |    |    |    |    |    |    |    | 0  |    |
| D6 |    |    |    |    |    |    |    |    |    |    |    |    |    |    |    |    |
| D7 |    |    |    |    |    |    |    |    |    |    |    |    |    |    | 0  |    |
| D8 |    |    |    |    |    |    |    |    |    |    |    |    |    |    | 0  |    |

FIG.5 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    |    |    |    |    |    |    |    |    |    |    |    |    |    |    |    |
| D2 |    |    |    |    |    |    | 0  |    |    |    |    |    |    |    |    |    |
| D3 |    |    |    |    |    |    |    |    |    |    |    |    |    |    |    |    |
| D4 |    |    |    |    | 0  |    |    |    | 0  |    |    |    |    |    |    |    |
| D5 |    |    |    |    |    |    |    |    |    |    |    |    |    |    |    |    |
| D6 |    |    |    |    |    |    | 0  |    |    |    |    |    |    |    |    |    |
| D7 |    |    |    |    |    |    |    |    |    |    |    |    |    |    |    |    |
| D8 |    |    |    |    |    |    |    |    |    |    |    |    |    |    |    |    |

FIG.5 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    |    |    |    |    |    |    |    |    |    |    |    |    |    |    |    |
| D2 |    | 0  |    | 0  |    |    |    |    |    | 0  |    | 0  | 0  |    |    |    |
| D3 |    | 0  |    | 0  |    |    |    |    |    |    |    |    |    | 0  |    |    |
| D4 | 0  |    |    |    |    |    |    |    |    |    |    |    |    |    |    |    |
| D5 |    |    | 0  |    |    |    |    |    |    |    |    |    |    |    |    |    |
| D6 | 0  |    |    |    |    |    |    |    |    | 0  | 0  |    |    |    |    |    |
| D7 |    |    |    |    |    | 0  |    |    |    |    |    |    |    | 0  | 0  |    |
| D8 |    |    |    |    |    |    |    |    |    |    |    |    |    |    |    |    |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    | 0  |    |    |    |    |    |     |     |     |     |     |     |     |
| D3 |    |    |    | 0  |    |    |    |    |    |     |     |     |     |     |     |     |
| D4 |    |    |    |    |    |    |    |    |    |     | 0   | 0   |     |     |     |     |
| D5 |    |    | 0  |    |    |    |    |    |    |     |     |     | 0   |     |     |     |
| D6 |    |    |    |    | 0  |    |    |    |    |     |     |     |     | 0   |     |     |
| D7 |    |    |    |    |    |    |    |    |    |     |     |     |     |     |     |     |
| D8 |    |    |    |    |    |    |    |    |    |     |     |     |     |     |     |     |

FIG.5 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    | 0  |    |    |    |    |    |    |     |     |     |     |     |     |     |
| D3 |    |    |    | 0  |    |    |    |    |    |     |     |     |     |     |     |     |
| D4 |    |    |    |    |    |    |    |    |    |     |     |     |     |     |     |     |
| D5 |    |    |    |    |    | 0  |    |    |    |     |     |     |     |     |     |     |
| D6 |    |    |    |    |    |    | 0  |    |    |     |     |     |     |     |     |     |
| D7 |    |    |    |    |    |    |    |    |    |     |     |     |     |     |     |     |
| D8 |    |    |    |    |    |    |    |    |    |     |     |     |     |     |     |     |

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | O | | | | | | | | | | | | | | |
| D3 | | O | | | | | | | | | | | | | | |
| D4 | | O | | | | | | | | | | | | | | |
| D5 | | | O | | | | | | | | | | O | O | O | |
| D6 | | | | O | | | | | | | O | | | | | |
| D7 | | | | | | | | | | | | O | | | | |
| D8 | | | | | | | | | | | | | | | | |

FIG. 6 (b)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | O | | | | | | | | | | | | | | |
| D3 | | | O | | | | | | O | O | | | | | | |
| D4 | | | | O | | | | | | | O | | | | | |
| D5 | | | | | O | | | | | | | O | | | | |
| D6 | | | | | O | | | | | | | | O | | | |
| D7 | | | | | | | | | | | | | | | | |
| D8 | | | | | | | | | | | | | | | | |

FIG. 6 (c)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | | | | | | | | | | | | | |
| D3 | | | | | O | | | | | | | | | | | |
| D4 | | | | | | O | | | | | | | | | | |
| D5 | | | | | | | O | | | | | | | | | |
| D6 | | | | | | | | O | | | | | | | | |
| D7 | | | | | | | | | O | | | | | | | |
| D8 | | | | | | | | | | | | | | | | |

FIG. 6 (d)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | | | O | | | | | | | | | | |
| D3 | | | | | O | | O | | | | | | | | | |
| D4 | | | | | | O | | | | | | | | | | |
| D5 | | | | | | | | | | | | | | | | |
| D6 | | | | O | | | | | | | | | | | | |
| D7 | | | | | | | | | | | | | | | | |
| D8 | | | | | | | | | | | | | | | | |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    | 0  |    | 0  |    |    |    |     |     |     |     |     |     |     |
| D3 |    |    |    |    |    |    |    |    |    |     |     |     |     |     |     |     |
| D4 |    |    |    |    |    |    |    |    |    |     |     |     |     | 0   |     |     |
| D5 |    |    |    | 0  |    | 0  |    |    |    | 0   | 0   |     |     |     |     |     |
| D6 |    |    | 0  |    |    |    |    |    |    |     |     |     |     |     |     |     |
| D7 |    |    |    |    |    |    |    |    |    | 0   | 0   |     |     |     |     |     |
| D8 |    |    |    |    |    |    |    |    |    |     |     |     |     |     |     |     |

FIG.6 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    | 0  |    |    |    |    |    |     |     |     |     |     |     |     |
| D3 |    |    |    |    | 0  |    | 0  |    |    |     |     |     |     |     |     |     |
| D4 |    |    |    |    | 0  |    |    |    |    |     | 0   |     |     |     |     |     |
| D5 |    |    |    |    |    |    |    |    |    | 0   |     |     | 0   | 0   |     |     |
| D6 |    |    |    |    | 0  |    |    |    |    |     | 0   |     |     |     |     |     |
| D7 |    |    |    |    |    |    |    |    |    |     |     |     |     |     |     |     |
| D8 |    |    |    |    |    |    |    |    |    |     |     |     |     |     |     |     |

FIG.6 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    | 0  |    |    |    |    |    |    |    |     |     |     |     |     |     |     |
| D3 |    | 0  |    |    |    |    |    |    | 0  | 0   | 0   |     | 0   | 0   |     |     |
| D4 |    |    |    |    |    |    |    |    |    |     |     |     |     |     |     |     |
| D5 |    | 0  |    |    |    |    |    |    |    |     |     |     |     |     |     |     |
| D6 |    | 0  |    |    |    |    |    |    |    |     |     |     |     |     |     |     |
| D7 |    | 0  |    |    |    |    |    |    |    |     |     |     |     |     |     |     |
| D8 |    |    |    |    |    |    |    |    |    |     |     |     |     |     |     |     |

FIG.6 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    | 0  |    |    |    |     |     |     |     |     |     |     |
| D2 |    | 0  |    |    |    | 0  |    |    |    |     |     |     | 0   | 0   | 0   | 0   |
| D3 |    | 0  |    |    |    | 0  |    |    |    |     | 0   |     |     |     |     |     |
| D4 |    | 0  |    |    | 0  |    |    |    |    |     |     |     |     |     |     |     |
| D5 |    | 0  |    |    | 0  |    |    |    |    |     |     |     |     |     |     |     |
| D6 |    |    | 0  |    |    |    |    |    |    |     |     |     | 0   | 0   | 0   |     |
| D7 |    |    |    |    |    |    |    |    |    | 0   | 0   |     |     |     |     |     |
| D8 |    |    |    |    |    |    |    |    |    |     |     |     |     |     |     |     |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    | 0  | 0  | 0  | 0  | 0  | 0  |    |    |     |     |     |     |     |     |     |
| D3 |    |    |    |    |    |    |    |    |    |     |     | 0   |     |     |     |     |
| D4 |    |    |    |    |    |    |    |    |    |     |     | 0   |     |     |     |     |
| D5 |    |    |    |    |    |    |    |    |    |     |     | 0   |     |     |     |     |
| D6 |    |    |    |    |    |    |    |    |    |     |     | 0   |     |     |     |     |
| D7 |    |    |    |    |    |    |    |    |    |     |     | 0   |     |     |     |     |
| D8 |    |    |    |    |    |    |    |    |    |     |     | 0   |     |     |     |     |

FIG. 7 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | 0  |    |    | 0  |    |    |    |    |     |     |     |     |     |     | 0   |
| D2 |    | 0  |    |    | 0  |    |    |    |    |     | 0   | 0   | 0   | 0   | 0   |     |
| D3 |    | 0  |    |    | 0  | 0  |    |    |    |     |     |     |     |     |     |     |
| D4 |    | 0  |    |    | 0  |    | 0  |    |    |     |     |     |     | 0   | 0   |     |
| D5 |    | 0  |    | 0  |    |    | 0  |    |    | 0   | 0   | 0   | 0   |     |     |     |
| D6 | 0  |    |    | 0  |    |    | 0  |    |    |     |     |     |     |     |     |     |
| D7 |    |    |    |    |    |    | 0  |    |    |     |     |     |     | 0   | 0   | 0   |
| D8 |    |    |    |    |    |    | 0  |    |    |     | 0   | 0   | 0   |     |     |     |

FIG. 7 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | 0  |    |    |    |    |    |    |    |     | 0   | 0   | 0   |     |     |     |
| D2 |    | 0  |    |    | 0  |    |    |    |    |     |     |     |     | 0   | 0   |     |
| D3 |    | 0  |    |    | 0  |    |    |    |    |     | 0   |     |     |     |     |     |
| D4 |    | 0  |    |    | 0  |    |    |    |    |     |     |     |     |     |     |     |
| D5 |    |    | 0  |    |    | 0  |    |    |    |     |     |     |     |     |     |     |
| D6 |    |    |    | 0  |    | 0  |    |    |    |     | 0   | 0   | 0   | 0   |     |     |
| D7 |    |    |    |    |    |    |    | 0  |    |     |     |     |     |     | 0   |     |
| D8 |    |    |    |    |    |    |    |    |    |     |     |     |     |     |     | 0   |

FIG. 7 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 | 0  |    |    | 0  |    |    |    |    |    |     |     | 0   |     |     |     |     |
| D2 | 0  |    |    | 0  |    |    |    | 0  | 0  | 0   |     |     |     |     |     |     |
| D3 | 0  |    |    |    | 0  |    |    |    |    |     |     | 0   |     |     |     |     |
| D4 |    | 0  |    |    | 0  |    |    |    |    |     |     |     | 0   |     |     |     |
| D5 |    |    | 0  |    |    | 0  |    |    |    |     |     |     |     |     |     | 0   |
| D6 |    |    |    | 0  |    |    | 0  |    |    |     |     |     |     |     | 0   |     |
| D7 |    |    |    |    |    |    |    |    |    |     |     |     | 0   | 0   |     |     |
| D8 |    |    |    |    |    |    |    |    |    |     | 0   | 0   |     |     |     |     |

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | | | | | | | | | | | | | |
| D3 | | 0 | | 0 | | | | | | | | | | | | |
| D4 | | 0 | | 0 | | | | | | | 0 | 0 | | 0 | | |
| D5 | | | | | | | | | | | 0 | 0 | | 0 | | |
| D6 | | 0 | | 0 | | | | | | | | | | | | |
| D7 | | | | | | | | | | | | | | | | |
| D8 | | | | | | | | | | | | | | | | |

FIG.7 (e)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | | | | | | | | | | | | | |
| D3 | | | 0 | | 0 | | | | | | | | | 0 | 0 | |
| D4 | | | | | | | | | | | 0 | | 0 | | | |
| D5 | | | 0 | | 0 | | | | | | 0 | | 0 | | | |
| D6 | | 0 | | | | | | | | | | | | | | |
| D7 | | 0 | | | | | | | | | | | | | | |
| D8 | | | | | | | | | | | | | | | | |

FIG.7 (f)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | 0 | | 0 | | | | | | | | | | |
| D3 | | | | | | | | | | | | | | 0 | | |
| D4 | | | | 0 | | 0 | | | | | | | 0 | | | |
| D5 | | | 0 | | | | | | | 0 | | 0 | | | | |
| D6 | | 0 | | | | | | | | | | | | | | |
| D7 | | | | | | | | | | 0 | | 0 | | | | |
| D8 | | | | | | | | | | | | | | | | |

FIG.7 (g)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | 0 | | | | | | | | | | | | | | |
| D2 | | | 0 | | | | | | | | | | 0 | 0 | | |
| D3 | | | | 0 | | | | | | | | 0 | | | | |
| D4 | | | | | 0 | | | | | | 0 | | | | | |
| D5 | | | | | | 0 | | | | 0 | | | | | | |
| D6 | | | | | | | | | 0 | | | | | | | |
| D7 | | | | | | | 0 | | | | | | | | | |
| D8 | | | | | | | | | | | | | | | | |

FIG.8 (a)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | | 0 | | | | | | | | | | | |
| D3 | | | | | | 0 | | | | | | | | | | |
| D4 | | | | | | | 0 | | | | | | | | | |
| D5 | | | | | | | | | | | | | | | | |
| D6 | | | | | | | | | 0 | | | | | | | |
| D7 | | | | | | | | | | 0 | | | | | | |
| D8 | | | | | | | | | | | 0 | | | | | |

FIG.8 (b)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | 0 | | | | | | | | | | | | | |
| D3 | | 0 | | 0 | | | | | | | | | | | | |
| D4 | | | 0 | | | | | | | | 0 | | | | | |
| D5 | | | 0 | | | | | | 0 | | 0 | | 0 | 0 | | |
| D6 | | | | | | | | | | | | | | | | |
| D7 | | | 0 | | | | | | | 0 | | | | | | |
| D8 | | | | | | | | | | | | | | | | |

FIG.8 (c)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | 0 | | | | | | 0 | | | | | | |
| D3 | | | 0 | | 0 | | | | | | | | | | | |
| D4 | | | | | | | | | | | 0 | 0 | | | | |
| D5 | | | | | 0 | | | | | | | | 0 | | | |
| D6 | | 0 | 0 | | | | | | | 0 | | | | | | |
| D7 | | | | | | | | | | | | | 0 | | | |
| D8 | | | | | | | | | | | | | | | | |

FIG.8 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  |    |    |    |    |     |     |     |     |     |     |     |
| D2 |    |    |    |    |    |    |    |    |    |     |     |     |     |     |     |     |
| D3 |    |    |    | 0  |    | 0  |    |    |    |     |     |     |     |     |     |     |
| D4 |    |    |    |    | 0  |    |    |    |    | 0   |     |     |     |     |     |     |
| D5 |    |    |    |    |    |    |    |    | 0  |     |     | 0   |     |     |     |     |
| D6 |    |    | 0  |    |    |    |    |    |    |     |     |     |     | 0   |     |     |
| D7 |    | 0  |    |    |    |    |    |    |    | 0   |     |     |     |     |     |     |
| D8 |    |    |    |    |    |    |    |    |    |     |     |     |     | 0   |     |     |

FIG.8 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    |    |    |    |    |     |     |     |     |     |     |     |
| D3 |    |    |    |    |    | 0  |    |    |    |     |     |     |     |     |     |     |
| D4 |    |    |    |    |    |    |    |    |    |     |     |     |     |     |     |     |
| D5 |    |    |    |    |    | 0  | 0  | 0  |    |     |     |     |     |     |     |     |
| D6 |    |    |    |    |    |    |    |    |    |     |     |     |     |     |     |     |
| D7 |    |    |    |    |    |    | 0  | 0  |    |     |     |     |     |     |     |     |
| D8 |    |    |    |    |    |    |    |    |    |     |     |     |     |     |     |     |

FIG.8 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    |    |    |    |    |     |     |     |     |     |     |     |
| D3 |    |    |    |    |    |    | 0  |    |    |     |     |     |     |     |     |     |
| D4 |    |    |    |    |    | 0  |    | 0  | 0  |     |     |     |     |     |     |     |
| D5 |    |    |    |    |    |    | 0  |    |    |     |     |     |     |     |     |     |
| D6 |    |    |    |    |    |    | 0  |    |    |     |     |     |     |     |     |     |
| D7 |    |    |    |    |    |    |    |    |    |     |     |     |     |     |     |     |
| D8 |    |    |    |    |    |    |    |    |    |     |     |     |     |     |     |     |

FIG.8 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    |    |    |    |    |    |    |    |    |    |    |    |    |    |    |    |
| D2 | 0  | 0  | 0  | 0  |    | 0  | 0  | 0  |    |    |    |    |    |    | 0  |    |
| D3 |    |    |    |    |    |    |    |    |    |    |    |    |    |    | 0  |    |
| D4 |    |    |    |    |    |    |    |    |    |    |    |    |    |    | 0  |    |
| D5 |    |    |    |    |    |    |    |    |    |    |    |    |    |    | 0  |    |
| D6 |    |    |    |    |    |    |    |    |    |    |    |    |    |    | 0  |    |
| D7 |    |    |    |    |    |    |    |    |    |    |    |    |    |    | 0  |    |
| D8 |    |    |    |    |    |    |    |    |    |    |    |    |    |    | 0  |    |

FIG.9 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 | 0  | 0  | 0  | 0  | 0  |    | 0  |    |    |    |    | 0  |    | 0  |    | 0  |
| D2 |    |    |    |    |    |    |    | 0  |    |    |    | 0  |    | 0  |    | 0  |
| D3 | 0  | 0  | 0  | 0  | 0  |    |    |    |    |    |    | 0  |    | 0  |    | 0  |
| D4 |    |    |    |    | 0  | 0  |    |    |    |    |    | 0  |    | 0  |    | 0  |
| D5 |    |    |    |    |    |    |    |    |    |    | 0  |    |    | 0  |    | 0  |
| D6 | 0  | 0  | 0  | 0  |    |    |    |    |    |    | 0  |    | 0  |    |    | 0  |
| D7 |    |    |    |    | 0  | 0  | 0  |    |    |    | 0  |    | 0  |    | 0  |    |
| D8 |    |    |    |    |    |    |    |    |    |    |    |    |    |    |    |    |

FIG.9 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    | 0  | 0  | 0  | 0  | 0  |    |    |    |    |    | 0  |    | 0  |    |    |
| D2 |    |    |    |    |    |    | 0  |    |    |    |    | 0  |    | 0  |    | 0  |
| D3 |    |    |    |    |    |    |    | 0  |    |    |    | 0  |    | 0  |    | 0  |
| D4 | 0  | 0  | 0  | 0  |    |    |    |    |    |    | 0  |    |    | 0  |    | 0  |
| D5 |    |    |    |    | 0  | 0  |    |    |    |    | 0  |    | 0  |    |    | 0  |
| D6 |    |    |    |    |    |    | 0  |    |    | 0  |    |    | 0  |    |    | 0  |
| D7 |    |    |    |    |    |    |    |    |    | 0  |    | 0  |    |    | 0  |    |
| D8 |    |    |    |    |    |    |    |    |    |    |    |    |    | 0  |    |    |

FIG.9 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|----|----|----|----|----|----|----|
| D1 |    |    |    |    |    |    |    |    |    |    |    |    |    |    |    |    |
| D2 |    | 0  | 0  | 0  | 0  |    |    |    |    |    |    |    | 0  |    |    |    |
| D3 |    |    |    |    |    | 0  |    |    |    |    |    |    |    |    |    | 0  |
| D4 |    |    |    |    |    |    | 0  |    |    |    |    |    |    |    |    | 0  |
| D5 |    |    |    |    |    |    |    | 0  |    |    |    |    |    |    |    | 0  |
| D6 |    |    |    |    |    |    |    |    |    |    |    |    |    |    |    | 0  |
| D7 |    |    |    |    |    |    |    |    |    |    |    |    |    |    | 0  |    |
| D8 |    |    |    |    |    |    |    |    |    |    |    |    |    | 0  |    |    |

FIG.9 (d)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | O | | O | | | | | | | O | | | |
| D3 | | | | | | | | | | | | | O | | | |
| D4 | | | | O | | O | | | | | | | | | | |
| D5 | O | O | O | | | | | | | | | | O | | | |
| D6 | | | | | | | | | | O | O | | | | | |
| D7 | | | | | | | | | | | | | | | | |
| D8 | | | | | | | | | | O | O | | | | | |

FIG.9 (e)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | O | | | O | | | | | | O | | | |
| D3 | | | | | | | | | | | | O | | | | |
| D4 | | | | O | | | O | | | | | | | | | |
| D5 | | O | O | | | | | | | | | O | | | | |
| D6 | | | | | | | | | | O | O | | | | | |
| D7 | | | | | | | | | | | | | | | | |
| D8 | O | | | | | | | | | O | O | | | | | |

FIG.9 (f)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | | | O | O | | | | | | | | | | |
| D3 | | | | | | | | | | | | | | O | | |
| D4 | | | | | O | O | | | | | | | O | | | |
| D5 | | | | O | | | | | | | | | O | | | |
| D6 | | O | | | | | | | O | O | | | | | | |
| D7 | | O | | | | | | | O | O | | | | | | |
| D8 | | | | | | | | | | | | | | | | |

FIG.9 (g)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | | O | O | | | | | O | | O | O | | | | |
| D3 | | | O | O | | | | | | | | | | | | |
| D4 | | | | | | | | | O | | O | O | | | | |
| D5 | | | O | O | | | | | | | | | | | | |
| D6 | | | | | | | | | | | | | | O | | |
| D7 | | O | | | | | | | | | | | | | | |
| D8 | | | | | | | | | | | | | | | | |

FIG.9 (h)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|----|----|----|----|----|----|----|
| D1  |    |    | O  |    |    |    |    |    |    |    |    |    |    |    |    |    |
| D2  |    | O  |    |    | O  |    |    |    |    |    |    |    |    |    |    |    |
| D3  |    |    | O  |    |    |    |    |    |    |    |    |    |    |    |    |    |
| D4  |    |    | O  |    |    |    |    |    | O  |    |    |    |    |    |    |    |
| D5  |    |    | O  |    |    |    |    |    |    |    |    |    |    |    |    |    |
| D6  |    |    |    |    |    |    |    |    | O  |    | O  |    | O  | O  |    |    |
| D7  |    |    | O  |    |    |    |    |    | O  |    |    |    |    |    |    |    |
| D8  |    |    |    |    |    |    |    |    |    |    |    |    |    |    |    |    |

FIG.10 (a)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|----|----|----|----|----|----|----|
| D1  |    |    |    |    | O  |    |    |    |    |    |    |    |    |    |    |    |
| D2  |    |    |    |    |    |    |    |    |    |    |    |    |    |    |    |    |
| D3  |    |    |    | O  |    | O  |    |    |    |    |    |    | O  |    |    |    |
| D4  |    |    |    |    | O  |    |    |    |    |    | O  |    | O  |    |    |    |
| D5  |    | O  |    |    |    |    |    |    |    |    |    |    |    |    |    |    |
| D6  |    | O  |    |    |    |    |    |    |    |    |    |    | O  |    |    |    |
| D7  |    | O  |    |    |    |    |    |    | O  | O  | O  |    |    |    |    |    |
| D8  |    |    |    |    |    |    |    |    |    |    |    |    |    |    |    |    |

FIG.10 (b)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|----|----|----|----|----|----|----|
| D1  |    |    | O  |    |    |    |    |    |    |    |    |    |    |    |    |    |
| D2  | O  |    |    | O  |    |    |    |    |    |    |    | O  |    |    |    |    |
| D3  |    |    | O  |    |    |    |    |    |    |    | O  |    |    | O  |    |    |
| D4  |    |    |    |    | O  |    |    |    |    |    |    | O  |    |    |    |    |
| D5  |    |    |    |    | O  |    |    |    |    |    |    |    |    |    |    |    |
| D6  |    |    |    |    |    |    | O  |    |    | O  | O  |    |    |    |    |    |
| D7  |    |    |    |    |    |    |    | O  |    |    |    |    |    |    |    |    |
| D8  |    |    |    |    |    |    |    |    |    |    |    |    |    |    |    |    |

FIG.10 (c)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|----|----|----|----|----|----|----|
| D1  |    |    | O  |    |    |    |    |    |    |    |    |    |    | O  |    |    |
| D2  |    | O  |    | O  |    |    |    |    |    |    |    |    |    |    |    |    |
| D3  |    |    | O  |    |    |    |    |    |    |    |    | O  |    | O  |    |    |
| D4  |    |    |    |    | O  |    |    |    |    |    |    |    | O  |    |    |    |
| D5  |    |    |    |    |    | O  |    |    |    |    |    |    |    |    |    |    |
| D6  |    |    |    |    |    |    | O  |    |    |    | O  |    |    |    |    |    |
| D7  |    |    |    |    |    |    |    |    |    |    |    | O  |    |    |    |    |
| D8  |    |    |    |    |    |    |    |    | O  |    |    |    |    |    |    |    |

FIG.10 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     | 0   |
| D2 | 0  | 0  | 0  |    |    |    |    |    |    |     |     |     |     |     |     | 0   |
| D3 |    |    |    | 0  |    |    |    |    |    |     |     |     |     |     |     | 0   |
| D4 |    |    |    |    | 0  |    |    |    |    |     |     |     |     |     | 0   |     |
| D5 |    |    |    |    |    | 0  |    |    |    |     |     |     |     | 0   |     |     |
| D6 |    |    |    |    |    |    | 0  |    |    |     |     |     | 0   |     |     |     |
| D7 |    |    |    |    |    |    |    |    |    |     |     | 0   |     |     |     |     |
| D8 |    |    |    |    |    |    |    |    |    |     |     |     |     |     |     |     |

FIG.10 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 | 0  | 0  |    |    |    |    |    |    |    |     |     |     |     |     | 0   |     |
| D2 |    |    | 0  |    |    |    |    |    |    |     |     |     |     |     | 0   |     |
| D3 |    |    |    | 0  |    |    |    |    |    |     |     |     |     | 0   |     |     |
| D4 |    |    |    |    | 0  |    |    |    |    |     |     |     | 0   |     |     |     |
| D5 |    |    |    |    |    | 0  |    |    |    |     |     | 0   |     |     |     |     |
| D6 |    |    |    |    |    |    | 0  |    |    |     | 0   |     |     |     |     |     |
| D7 |    |    |    |    |    |    |    |    |    | 0   |     |     |     |     |     |     |
| D8 |    |    |    |    |    |    |    |    |    |     |     |     |     |     |     |     |

FIG.10 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    |    |    |    |    |     |     |     |     |     |     |     |
| D2 |    |    |    |    | 0  |    |    |    |    |     |     |     |     |     |     |     |
| D3 |    |    |    |    |    |    |    |    |    |     |     |     |     |     |     |     |
| D4 |    |    |    |    |    |    | 0  |    |    |     |     |     |     |     |     |     |
| D5 |    |    |    |    |    |    |    | 0  |    |     |     |     |     |     |     |     |
| D6 |    |    |    |    |    |    |    |    | 0  |     |     |     |     |     |     |     |
| D7 |    |    |    |    |    |    |    |    |    | 0   |     |     |     |     |     |     |
| D8 |    |    |    |    |    | 0  |    |    |    |     |     |     |     |     |     |     |

FIG.10 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    |    |    |    |    |     |     |     |     |     |     |     |
| D3 |    |    |    | 0  |    |    | 0  |    | 0  |     |     |     |     |     |     |     |
| D4 |    |    |    |    | 0  |    |    |    |    |     |     |     |     |     |     |     |
| D5 |    |    |    |    |    |    |    | 0  |    |     |     |     |     |     |     |     |
| D6 |    |    |    |    |    |    |    | 0  |    |     |     |     |     |     |     |     |
| D7 |    |    |    |    |    |    |    | 0  |    |     |     |     |     |     |     |     |
| D8 |    |    |    |    |    |    |    |    |    |     |     |     |     |     |     |     |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    | O  |    | O  |    |    |    |    |    |     |     |     |     |     |     |     |
| D3 |    | O  |    | O  |    |    |    |    |    | O   | O   |     | O   |     | O   |     |
| D4 |    | O  |    | O  |    |    |    |    |    |     |     |     |     |     |     |     |
| D5 |    |    |    |    |    |    |    |    |    | O   | O   |     | O   |     | O   |     |
| D6 |    | O  |    | O  |    |    |    |    |    |     |     |     |     |     |     |     |
| D7 |    |    |    |    |    |    |    |    |    |     |     |     |     |     |     |     |
| D8 |    |    |    |    |    |    |    |    |    |     |     |     |     |     |     |     |

FIG.11 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | O  |    | O  |    |    |    |    |     |     |     |     |     |     |     |
| D2 |    |    | O  |    | O  |    |    |    |    |     |     |     |     |     |     |     |
| D3 |    |    | O  |    | O  |    |    |    |    |     |     |     | O   |     | O   | O   |
| D4 |    | O  |    |    |    |    |    |    |    |     |     |     |     |     |     |     |
| D5 |    |    |    |    |    |    |    |    |    |     |     |     | O   |     | O   | O   |
| D6 |    | O  |    |    |    |    |    |    |    |     |     |     |     |     |     |     |
| D7 |    |    |    |    |    |    |    |    |    | O   | O   |     |     |     |     |     |
| D8 |    |    |    |    |    |    |    |    |    |     |     |     |     |     |     |     |

FIG.11 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | O  | O  |    |    |    |    |     |     |     |     |     |     |     |
| D2 |    |    |    | O  | O  |    |    |    |    |     |     |     |     | O   |     |     |
| D3 |    |    |    | O  | O  |    |    |    |    |     |     |     |     |     |     |     |
| D4 |    |    | O  |    |    |    |    |    |    |     |     |     | O   |     |     |     |
| D5 |    | O  |    |    |    |    |    |    | O  |     | O   | O   |     |     |     |     |
| D6 |    |    |    |    |    |    |    |    | O  |     | O   | O   |     |     |     |     |
| D7 |    |    |    |    |    |    |    |    |    |     |     |     |     |     |     |     |
| D8 |    |    |    |    |    |    |    |    |    |     |     |     |     |     |     |     |

FIG.11 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | O  | O  |    |    |    |    |     |     |     |     |     |     |     |
| D2 |    |    | O  | O  |    |    |    |    |    |     |     |     |     |     |     |     |
| D3 |    |    | O  |    |    |    |    |    |    |     |     | O   | O   | O   |     | O   |
| D4 |    |    | O  |    |    |    |    |    | O  | O   |     |     |     |     |     |     |
| D5 |    |    | O  |    |    |    |    |    |    |     |     |     |     |     |     |     |
| D6 |    |    | O  |    |    |    |    |    | O  | O   |     |     |     |     |     |     |
| D7 |    |    |    |    |    |    |    |    |    |     |     |     |     |     |     |     |
| D8 |    |    |    |    |    |    |    |    |    |     |     |     |     |     |     |     |

FIG.11 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    | 0  |    |    |    |     |     |     |     |     |     |     |
| D2 |    |    |    | 0  | 0  |    |    |    |    |     |     |     |     |     |     |     |
| D3 |    |    | 0  |    |    |    |    |    | 0  | 0   |     |     |     |     |     |     |
| D4 |    |    |    | 0  |    |    |    |    | 0  | 0   |     |     |     |     |     |     |
| D5 |    |    |    |    |    |    |    |    |    |     | 0   | 0   | 0   |     |     |     |
| D6 |    |    | 0  |    |    |    |    |    |    |     |     |     |     | 0   |     |     |
| D7 |    | 0  |    |    |    |    |    |    |    |     |     |     |     |     |     |     |
| D8 |    |    |    |    |    |    |    |    |    |     |     |     |     |     |     |     |

FIG.11 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  | 0  |    |    |    |     |     |     |     |     |     |     |
| D2 |    |    |    |    |    |    |    |    |    |     |     |     |     |     | 0   |     |
| D3 |    |    |    |    | 0  | 0  |    |    |    |     |     |     |     | 0   |     |     |
| D4 |    |    |    |    | 0  |    |    |    |    |     |     |     |     |     |     |     |
| D5 |    |    |    |    | 0  |    |    |    |    |     |     | 0   | 0   |     |     |     |
| D6 |    |    | 0  |    |    |    |    |    | 0  | 0   |     |     |     |     |     |     |
| D7 |    | 0  |    |    |    |    |    |    |    |     |     |     |     |     |     |     |
| D8 |    |    |    |    |    |    |    |    | 0  | 0   |     |     |     |     |     |     |

FIG.11 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  | 0  |    |    |    |     |     |     |     | 0   |     |     |
| D2 |    |    |    |    | 0  | 0  |    |    |    |     |     |     | 0   |     |     |     |
| D3 |    |    |    | 0  |    |    |    |    |    |     |     |     |     |     |     |     |
| D4 |    |    | 0  |    |    |    |    |    |    |     |     | 0   |     |     |     |     |
| D5 |    | 0  |    |    |    |    |    |    |    |     | 0   |     |     |     |     |     |
| D6 |    |    |    |    |    |    |    | 0  | 0  |     |     |     |     |     |     |     |
| D7 | 0  |    |    |    |    |    |    |    |    |     |     |     |     |     |     |     |
| D8 |    |    |    |    |    |    |    | 0  | 0  |     |     |     |     |     |     |     |

FIG.11 (h)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | 0  |    |    |    |    |    |    |    |     |     |     |     |     |     |     |
| D2 |    |    | 0  |    |    |    |    |    |    |     |     |     |     |     |     |     |
| D3 |    |    |    | 0  |    |    |    |    |    |     |     |     |     |     |     |     |
| D4 |    |    |    |    | 0  |    |    |    |    |     |     |     |     |     |     |     |
| D5 |    |    |    |    |    | 0  |    |    |    |     |     |     |     |     |     |     |
| D6 |    |    |    |    |    |    |    |    | 0  |     |     |     |     |     |     |     |
| D7 |    |    |    |    |    |    |    |    |    | 0   |     |     |     |     |     |     |
| D8 |    |    |    |    |    |    |    |    |    |     | 0   |     |     |     |     |     |

FIG.12 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | o  |    |    |    |    |     |     |     |     |     |     |     |
| D2 |    |    |    | o  |    | o  |    |    |    |     |     |     |     |     |     |     |
| D3 |    |    |    |    |    |    |    |    |    |     |     |     |     |     |     |     |
| D4 |    |    |    |    | o  |    |    |    |    |     |     |     |     |     |     |     |
| D5 |    |    |    |    |    |    |    |    |    |     | o   |     |     |     |     |     |
| D6 |    |    |    |    |    |    |    | o  |    |     | o   |     |     |     |     |     |
| D7 |    |    |    |    |    |    |    |    |    |     |     |     |     |     |     |     |
| D8 |    |    |    |    |    |    |    |    |    |     | o   |     |     |     |     |     |

FIG.12 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | o  |    |    |    |    |    |     |     |     |     |     |     |     |
| D2 |    | o  |    |    | o  |    |    |    |    |     |     |     | o   | o   | o   |     |
| D3 |    |    |    | o  |    |    |    |    |    |     | o   |     |     |     |     |     |
| D4 |    |    |    |    |    | o  |    |    |    |     |     |     |     |     |     |     |
| D5 |    |    |    |    |    | o  |    |    |    |     | o   | o   |     |     |     |     |
| D6 |    |    |    |    |    | o  |    |    |    |     | o   |     |     |     |     |     |
| D7 |    |    |    |    |    | o  |    |    |    |     |     |     |     |     |     |     |
| D8 |    |    |    |    |    |    |    |    |    |     |     |     |     |     |     |     |

FIG.12 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | o  |    |    |    |    |    |    |     |     |     |     | o   | o   | o   |
| D2 |    | o  |    | o  |    |    |    |    |    |     |     |     |     |     |     |     |
| D3 |    |    | o  |    |    |    |    |    |    |     |     |     | o   |     |     |     |
| D4 |    |    |    |    | o  |    |    |    |    |     | o   |     |     |     |     |     |
| D5 |    |    |    |    |    | o  |    |    |    |     | o   | o   |     |     |     |     |
| D6 |    |    |    |    |    | o  |    |    |    |     |     |     |     |     |     |     |
| D7 |    |    |    |    |    | o  |    |    |    |     | o   |     |     |     |     |     |
| D8 |    |    |    |    |    |    |    |    |    |     |     |     |     |     |     |     |

FIG.12 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | o  |    |    |    |    |    |    |    |     |     |     | o   |     |     |     |
| D2 | o  |    | o  |    |    |    |    |    |    |     |     | o   |     |     |     |     |
| D3 |    | o  |    |    |    |    |    |    |    | o   |     |     |     |     |     |     |
| D4 |    |    |    |    | o  |    |    |    |    | o   | o   |     |     |     |     |     |
| D5 |    |    |    |    |    | o  |    |    |    |     | o   |     |     |     |     |     |
| D6 |    |    |    |    |    |    | o  |    |    |     |     |     |     | o   | o   |     |
| D7 |    |    |    |    |    |    | o  |    |    |     |     |     |     |     |     |     |
| D8 |    |    |    |    |    |    |    |    |    |     |     |     |     |     |     |     |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | 0  |    |    |    |    |    |    |     |     |     |     |     |     |     |
| D2 |    | 0  |    | 0  |    |    |    |    |    |     |     |     |     |     |     |     |
| D3 |    |    | 0  |    |    |    |    |    |    |     |     |     |     |     | 0   |     |
| D4 |    |    | 0  |    |    |    |    |    |    |     |     |     |     |     |     |     |
| D5 |    |    | 0  |    |    |    |    |    | 0  | 0   | 0   |     | 0   | 0   |     | 0   |
| D6 |    |    | 0  |    |    |    |    |    |    |     |     |     |     |     | 0   |     |
| D7 |    |    |    |    |    |    |    |    |    |     |     |     |     |     |     |     |
| D8 |    |    | 0  |    |    |    |    |    |    |     |     |     |     |     |     |     |

FIG. 12 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  |    |    |    |    |     |     |     |     |     |     |     |
| D2 |    |    |    | 0  |    | 0  |    |    |    |     |     |     |     |     |     |     |
| D3 |    |    |    |    |    |    |    |    |    |     |     |     |     |     |     |     |
| D4 |    |    |    |    | 0  |    |    |    |    |     |     |     |     |     |     |     |
| D5 |    |    |    |    |    |    | 0  |    | 0  |     |     |     |     |     |     |     |
| D6 |    |    |    |    |    |    |    |    |    |     |     |     |     |     |     |     |
| D7 |    |    |    |    |    |    | 0  |    | 0  |     |     |     |     |     |     |     |
| D8 |    |    |    |    |    |    |    |    |    |     |     |     |     |     |     |     |

FIG. 12 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    | 0  |    |    |    |     |     |     |     |     |     |     |
| D3 |    |    |    | 0  | 0  |    | 0  |    |    |     |     |     |     |     |     |     |
| D4 |    |    |    |    |    | 0  |    |    |    |     |     |     |     |     |     |     |
| D5 |    |    |    |    |    | 0  |    |    |    |     |     |     |     |     |     |     |
| D6 |    |    |    |    |    |    |    |    |    |     |     |     |     |     |     |     |
| D7 |    |    |    |    |    | 0  |    |    |    |     |     |     |     |     |     |     |
| D8 |    |    |    |    |    | 0  |    |    |    |     |     |     |     |     |     |     |

FIG. 12 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    | 0  |    |    | 0  | 0   |     |     |     |     |     |     |
| D3 |    |    |    |    |    |    |    |    |    |     |     |     |     |     |     |     |
| D4 |    |    |    |    |    |    | 0  |    |    |     |     |     |     |     |     |     |
| D5 |    |    |    |    |    |    | 0  |    |    |     |     |     |     |     |     |     |
| D6 |    |    |    |    |    | 0  |    | 0  |    |     |     |     |     |     |     |     |
| D7 |    |    |    |    |    |    | 0  |    |    |     |     |     |     |     |     |     |
| D8 |    |    |    |    |    |    |    |    |    |     |     |     |     |     |     |     |

FIG. 12 (h)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    |    |    |    |    |     |     |     |     |     |     |     |
| D2 |    | 0  |    |    | 0  |    |    |    |    |     |     |     |     |     |     |     |
| D3 |    |    |    | 0  |    |    |    |    |    |     |     |     |     |     |     |     |
| D4 |    |    |    |    |    | 0  |    |    |    |     |     |     |     |     |     |     |
| D5 |    |    |    |    |    |    | 0  |    |    |     |     |     |     |     |     |     |
| D6 |    |    |    |    |    |    |    |    |    |     |     |     |     |     |     |     |
| D7 |    |    |    |    |    |    |    |    |    | 0   |     |     |     |     |     |     |
| D8 |    |    |    |    |    |    |    |    |    |     | 0   |     |     |     |     |     |

FIG.13 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | 0  |    |    |    |    |    |    |    |     |     |     |     |     |     |     |
| D2 |    | 0  |    |    |    |    |    |    |    |     |     |     |     |     |     |     |
| D3 |    | 0  |    |    |    |    |    |    |    |     |     |     |     |     |     |     |
| D4 |    | 0  |    |    |    |    |    |    | 0  | 0   | 0   | 0   | 0   | 0   | 0   | 0   |
| D5 |    | 0  |    |    |    |    |    |    |    |     |     |     |     |     |     |     |
| D6 |    | 0  |    |    |    |    |    |    |    |     |     |     |     |     |     |     |
| D7 |    | 0  |    |    |    |    |    |    |    |     |     |     |     |     |     |     |
| D8 |    | 0  |    |    |    |    |    |    |    |     |     |     |     |     |     |     |

FIG.13 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | 0  |    |    |    |    |    |    |    |     |     |     |     |     |     |     |
| D2 |    | 0  |    |    |    |    |    |    |    |     |     |     |     |     |     |     |
| D3 |    | 0  |    |    |    |    |    |    | 0  | 0   | 0   |     | 0   | 0   | 0   | 0   |
| D4 |    | 0  |    |    |    |    |    |    |    |     |     | 0   |     |     |     |     |
| D5 |    | 0  |    |    |    |    |    |    |    |     |     |     |     |     |     |     |
| D6 |    |    | 0  |    |    |    |    |    |    |     |     |     |     |     |     |     |
| D7 |    | 0  |    |    |    |    |    |    |    |     |     |     |     |     |     |     |
| D8 |    | 0  |    |    |    |    |    |    |    |     |     |     |     |     |     |     |

FIG.13 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | 0  |    |    |    |    |    |    |    |     |     |     |     |     |     |     |
| D2 |    | 0  |    |    |    |    |    |    |    |     |     | 0   |     |     |     |     |
| D3 |    | 0  |    |    |    |    |    |    |    |     |     |     | 0   |     |     |     |
| D4 |    | 0  |    |    |    |    |    |    |    | 0   | 0   |     |     | 0   | 0   | 0   |
| D5 |    | 0  |    |    |    |    |    |    |    |     |     |     |     |     |     |     |
| D6 |    | 0  |    |    |    |    |    |    |    |     |     |     |     |     |     |     |
| D7 |    |    | 0  |    |    |    |    |    |    |     |     |     |     |     |     |     |
| D8 |    |    |    | 0  |    |    |    |    |    |     |     |     |     |     |     |     |

FIG.13 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | O  |    |    |    |    |    |    |    |     |     |     |     |     |     |     |
| D2 |    | O  |    |    |    |    | O  | O  | O  | O   | O   |     |     |     |     |     |
| D3 |    | O  |    |    |    |    |    |    |    |     |     | O   |     |     |     |     |
| D4 |    | O  |    |    |    |    |    |    |    |     |     |     |     | O   |     |     |
| D5 |    | O  |    |    |    |    |    |    |    |     |     |     |     |     |     |     |
| D6 |    |    | O  |    |    |    |    |    |    |     |     |     |     |     | O   |     |
| D7 |    |    |    | O  |    |    |    |    |    |     |     |     |     |     |     |     |
| D8 |    |    |    |    |    | O  |    |    |    |     |     |     |     |     |     |     |

FIG.13 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | O  |    |    |    |    |    |    |    |     |     |     |     |     |     |     |
| D2 |    | O  |    |    |    |    |    |    |    |     | O   |     |     |     |     |     |
| D3 |    | O  |    |    |    |    |    | O  | O  | O   |     |     |     |     | O   |     |
| D4 |    |    |    | O  |    |    |    |    |    |     |     | O   |     |     |     |     |
| D5 |    |    |    | O  |    |    |    |    |    |     |     |     | O   |     |     |     |
| D6 |    |    |    |    |    | O  |    |    |    |     |     |     |     | O   |     |     |
| D7 |    | O  |    |    |    |    |    |    |    |     |     |     |     |     |     |     |
| D8 |    |    |    |    |    | O  |    |    |    |     |     |     |     |     |     |     |

FIG.13 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | O  |    |    |    |    |    |    |    |     |     |     |     |     |     |     |
| D2 |    | O  |    |    |    |    |    | O  | O  | O   |     |     |     |     |     |     |
| D3 |    | O  |    |    |    |    |    |    |    |     | O   |     |     |     |     |     |
| D4 |    |    | O  |    |    |    |    |    |    |     |     | O   |     |     |     |     |
| D5 |    |    |    | O  |    |    |    |    |    |     |     |     | O   |     |     |     |
| D6 |    |    |    |    | O  |    |    |    |    |     |     |     |     | O   |     |     |
| D7 |    |    |    |    |    | O  |    |    |    |     |     |     |     |     | O   |     |
| D8 |    |    |    |    |    |    | O  |    |    |     |     |     |     |     |     |     |

FIG.13 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 | O  |    |    |    |    |    |    | O  | O  |     |     |     |     |     |     |     |
| D2 | O  |    |    |    |    |    |    |    |    | O   |     |     |     |     |     |     |
| D3 |    | O  |    |    |    |    |    |    |    |     | O   |     |     |     |     |     |
| D4 |    |    | O  |    |    |    |    |    |    |     |     | O   |     |     |     |     |
| D5 |    |    |    | O  |    |    |    |    |    |     |     |     | O   |     |     |     |
| D6 |    |    |    |    | O  |    |    |    |    |     |     |     |     | O   |     |     |
| D7 |    |    |    |    |    | O  |    |    |    |     |     |     |     |     | O   |     |
| D8 |    |    |    |    |    |    | O  |    |    |     |     |     |     |     |     |     |

FIG.13 (h)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | 0 | 0 | | | | | | | | | | | | |
| D2 | | | 0 | 0 | | | | | | | | | | | | |
| D3 | | | 0 | 0 | | | | | 0 | 0 | 0 | 0 | | | | |
| D4 | | | | | | | | | | | | | | | | |
| D5 | | | 0 | 0 | | | | | 0 | 0 | 0 | 0 | | | | |
| D6 | | | | | | | | | | | | | | 0 | | |
| D7 | | 0 | | | | | | | | | | | | | | |
| D8 | | | | | | | | | | | | | | | | |

FIG.14 (a)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | 0 | 0 | | | | | | | | | | | | |
| D2 | | | 0 | 0 | | | | | | | | | 0 | 0 | 0 | |
| D3 | | | 0 | 0 | | | | | 0 | 0 | | 0 | | | | |
| D4 | | 0 | | | | | | | | | | | | | | |
| D5 | | | | | | | | | 0 | 0 | | 0 | | | | |
| D6 | | 0 | | | | | | | | | | | | | | |
| D7 | | 0 | | | | | | | | | | | | | | |
| D8 | | | | | | | | | | | | | | | | |

FIG.14 (b)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | 0 | 0 | | | | | | | | | | | | |
| D2 | | | 0 | 0 | | | | | | | | 0 | 0 | | | |
| D3 | | | | | | | | | | | | 0 | | | | |
| D4 | | | 0 | 0 | | | | 0 | 0 | 0 | | | | | | |
| D5 | | 0 | | | | | | 0 | 0 | 0 | | | | | | |
| D6 | 0 | | | | | | | | | | | | | | | |
| D7 | 0 | | | | | | | | | | | | | | | |
| D8 | | | | | | | | | | | | | | | | |

FIG.14 (c)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | 0 | 0 | | | | | | | | | | | |
| D2 | | | | 0 | 0 | | | | | | | | | | | |
| D3 | | | | 0 | 0 | | | | | | | | 0 | | | |
| D4 | | | 0 | | | | | 0 | 0 | | 0 | | | | | |
| D5 | | 0 | | | | | | | | | | | | | | |
| D6 | 0 | | | | | | | 0 | 0 | | 0 | | | | | |
| D7 | | | | | | | | | | | | | | 0 | | |
| D8 | | | | | | | | | | | | | | 0 | | |

FIG.14 (d)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    | 0  | 0  |    |    |    |    |    |     |     |     |     |     |     |     |
| D2  |    |    | 0  | 0  |    |    |    |    |    |     |     |     |     |     |     |     |
| D3  |    | 0  |    |    |    |    |    |    |    |     |     |     |     |     |     |     |
| D4  |    | 0  |    |    |    |    |    |    |    |     |     |     |     |     |     |     |
| D5  |    | 0  |    |    |    |    | 0  |    | 0  |     |     |     |     |     |     |     |
| D6  |    | 0  |    |    |    |    |    |    | 0  |     | 0   | 0   |     | 0   |     |     |
| D7  |    | 0  |    |    |    |    | 0  |    | 0  |     |     |     |     |     |     |     |
| D8  |    |    |    |    |    |    |    |    |    |     |     |     |     |     |     |     |

FIG.14 (e)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    | 0  | 0  |    |    |    |    |    |     |     |     |     |     |     |     |
| D2  |    |    | 0  | 0  |    |    |    |    |    |     |     |     |     |     |     |     |
| D3  |    | 0  |    |    |    |    |    |    |    |     |     |     |     |     |     |     |
| D4  |    | 0  |    |    |    |    |    |    |    | 0   | 0   | 0   |     |     |     |     |
| D5  |    | 0  |    |    |    |    |    |    | 0  |     |     |     |     | 0   |     |     |
| D6  |    | 0  |    |    |    |    | 0  | 0  |    |     |     |     |     |     |     |     |
| D7  | 0  |    |    |    |    |    | 0  | 0  |    |     |     |     |     |     |     |     |
| D8  |    |    |    |    |    |    |    |    |    |     |     |     |     |     |     |     |

FIG.14 (f)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    | 0  | 0  |    |    |    |     |     |     |     |     |     |     |
| D2  |    |    |    |    | 0  | 0  |    |    |    |     |     |     |     |     |     |     |
| D3  |    |    |    | 0  |    |    |    |    |    |     |     |     | 0   | 0   |     |     |
| D4  |    |    |    | 0  |    |    |    |    |    |     |     | 0   |     |     |     |     |
| D5  |    |    |    | 0  |    |    |    |    |    |     |     |     |     |     |     |     |
| D6  |    |    | 0  |    |    |    |    |    |    |     | 0   |     |     |     | 0   |     |
| D7  |    | 0  |    |    |    |    |    | 0  | 0  |     |     |     |     |     |     |     |
| D8  |    |    |    |    |    |    |    | 0  | 0  |     |     |     |     |     |     |     |

FIG.14 (g)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    | 0  | 0  |    |    |    |     |     |     |     |     |     |     |
| D2  |    |    |    |    | 0  | 0  |    |    |    |     |     |     |     |     |     |     |
| D3  |    |    |    | 0  |    |    |    |    |    |     |     | 0   |     |     |     |     |
| D4  |    |    |    | 0  |    |    |    |    |    |     | 0   | 0   |     |     |     |     |
| D5  |    |    | 0  |    |    |    |    |    |    | 0   |     |     |     |     |     |     |
| D6  |    | 0  |    |    |    |    |    | 0  | 0  |     |     |     |     |     |     |     |
| D7  | 0  |    |    |    |    |    |    |    |    |     |     |     |     | 0   |     |     |
| D8  |    |    |    |    |    |    |    | 0  | 0  |     |     |     |     |     |     |     |

FIG.14 (h)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    | 0  | 0  |    |    |     |     |     |     |     |     |     |
| D3 |    |    |    |    |    | 0  | 0  |    |    |     |     |     |     |     |     |     |
| D4 |    |    |    |    | 0  |    |    |    |    |     |     |     |     |     |     |     |
| D5 |    |    |    | 0  |    |    |    |    |    |     |     |     |     |     |     |     |
| D6 |    |    | 0  |    |    |    |    |    |    |     |     |     |     |     |     |     |
| D7 |    | 0  |    |    |    |    |    |    |    |     |     |     |     |     |     |     |
| D8 | 0  |    |    |    |    |    |    |    |    |     |     |     |     |     |     |     |

FIG. 15 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    |    |    |    |    |     |     |     |     |     |     |     |
| D2 |    |    | 0  |    | 0  |    |    |    |    |     |     |     |     |     |     |     |
| D3 |    |    |    | 0  |    |    |    |    |    |     |     |     |     |     |     |     |
| D4 |    |    |    |    |    |    |    |    |    |     |     |     |     |     |     |     |
| D5 |    |    |    |    |    |    |    | 0  |    |     |     |     |     |     |     |     |
| D6 |    |    |    |    |    |    | 0  |    | 0  |     |     |     |     |     |     |     |
| D7 |    |    |    |    |    |    |    | 0  |    |     |     |     |     |     |     |     |
| D8 |    |    |    |    |    |    |    | 0  |    |     |     |     |     |     |     |     |

FIG. 15 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | 0  |    |    |    |    |    |    |     |     |     |     |     |     |     |
| D2 |    | 0  |    | 0  |    |    |    |    |    |     |     |     |     |     |     |     |
| D3 |    |    | 0  |    |    |    |    |    |    |     |     |     |     |     |     |     |
| D4 |    |    |    |    | 0  |    |    |    |    |     |     |     |     |     |     |     |
| D5 |    |    |    |    |    | 0  |    | 0  |    |     |     |     |     |     |     |     |
| D6 |    |    |    |    |    |    | 0  |    |    |     |     |     |     |     |     |     |
| D7 |    |    |    |    |    |    |    |    | 0  |     |     |     |     |     |     |     |
| D8 |    |    |    |    |    |    |    |    |    |     |     |     |     |     |     |     |

FIG. 15 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | 0  |    |    |    |    |    |    |     |     |     |     |     |     |     |
| D2 |    | 0  |    | 0  |    |    |    |    |    |     |     |     |     | 0   |     |     |
| D3 |    |    | 0  |    |    |    |    |    |    |     |     |     | 0   |     | 0   |     |
| D4 | 0  |    |    |    |    |    |    |    |    |     |     |     |     | 0   |     |     |
| D5 | 0  |    |    |    |    |    |    |    | 0  | 0   | 0   | 0   |     |     |     | 0   |
| D6 | 0  |    |    |    |    |    |    |    |    |     |     |     |     |     |     |     |
| D7 | 0  |    |    |    |    |    |    |    |    |     |     |     |     |     |     |     |
| D8 | 0  |    |    |    |    |    |    |    |    |     |     |     |     |     |     |     |

FIG. 15 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | 0  |    |    |    |    |    |    |     |     |     |     |     |     |     |
| D2 |    | 0  |    | 0  |    |    |    |    |    |     |     |     |     |     |     |     |
| D3 |    |    | 0  |    |    |    |    |    |    |     |     |     |     | 0   |     |     |
| D4 |    |    | 0  |    |    |    |    |    | 0  | 0   | 0   | 0   | 0   |     | 0   | 0   |
| D5 |    |    | 0  |    |    |    |    |    |    |     |     |     |     | 0   |     |     |
| D6 |    |    | 0  |    |    |    |    |    |    |     |     |     |     |     |     |     |
| D7 |    |    | 0  |    |    |    |    |    |    |     |     |     |     |     |     |     |
| D8 |    |    | 0  |    |    |    |    |    |    |     |     |     |     |     |     |     |

FIG. 15 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    |    |    |    |    |     |     |     |     |     |     |     |
| D2 |    |    | 0  |    | 0  |    |    |    |    |     |     |     |     | 0   |     |     |
| D3 |    |    |    | 0  |    |    |    |    |    |     |     |     | 0   |     | 0   |     |
| D4 |    | 0  |    |    |    |    |    |    | 0  | 0   | 0   |     |     |     |     |     |
| D5 |    | 0  |    |    |    |    |    | 0  |    |     |     |     |     | 0   |     |     |
| D6 |    | 0  |    |    |    |    | 0  |    |    |     |     |     |     |     |     |     |
| D7 |    | 0  |    |    |    |    |    |    |    |     |     |     |     |     |     |     |
| D8 | 0  |    |    |    |    |    |    |    |    |     |     |     |     |     |     |     |

FIG. 15 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  |    |    |    |    |     |     |     |     |     |     |     |
| D2 |    |    |    | 0  |    | 0  |    |    |    |     |     |     |     |     |     |     |
| D3 |    |    |    | 0  |    |    |    |    | 0  |     | 0   | 0   |     |     |     |     |
| D4 |    |    | 0  |    |    |    |    |    | 0  |     |     |     |     |     |     |     |
| D5 |    |    | 0  |    |    |    |    |    |    |     |     |     | 0   |     |     | 0   |
| D6 |    |    | 0  |    |    |    |    |    |    |     |     |     |     | 0   |     |     |
| D7 |    | 0  |    |    |    |    |    |    |    |     |     |     |     |     | 0   |     |
| D8 | 0  |    |    |    |    |    |    |    |    |     |     |     |     |     | 0   |     |

FIG. 15 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    | 0  | 0  |    |    |     |     |     |     |     |     |     |
| D2 |    |    |    |    | 0  |    |    |    |    |     |     |     |     | 0   | 0   |     |
| D3 |    |    |    |    | 0  |    |    |    |    | 0   |     |     |     |     |     |     |
| D4 |    |    |    | 0  |    |    |    |    | 0  |     | 0   |     |     |     |     |     |
| D5 |    |    |    |    | 0  |    |    |    |    | 0   |     |     |     |     |     |     |
| D6 |    |    | 0  |    |    |    |    |    |    |     |     | 0   |     |     |     |     |
| D7 |    | 0  |    |    |    |    |    |    |    |     |     |     | 0   |     |     |     |
| D8 | 0  |    |    |    |    |    |    |    |    |     |     |     |     |     |     | 0   |

FIG. 15 (h)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    | 0  |    |    |     |     |     |     |     |     |     |
| D2  |    |    |    |    |    | 0  |    | 0  |    |     |     |     |     |     |     |     |
| D3  |    |    |    |    |    |    | 0  |    |    |     |     |     |     |     |     |     |
| D4  |    |    |    |    | 0  |    |    |    |    |     |     |     |     |     |     |     |
| D5  |    |    |    | 0  |    |    |    |    |    |     |     |     |     |     |     |     |
| D6  |    |    | 0  |    |    |    |    |    |    |     |     |     |     |     |     |     |
| D7  |    | 0  |    |    |    |    |    |    |    |     |     |     |     |     |     |     |
| D8  | 0  |    |    |    |    |    |    |    |    |     |     |     |     |     |     |     |

FIG.16 (a)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    |    |    |    |    |    |    |    |    |     |     |     |     |     |     |     |
| D3  |    | 0  | 0  | 0  | 0  | 0  | 0  | 0  | 0  |     |     |     |     |     |     |     |
| D4  |    |    |    |    |    |    |    |    |    |     |     |     |     |     |     |     |
| D5  |    |    |    |    |    |    |    |    |    |     |     |     |     |     |     |     |
| D6  |    |    |    |    |    |    |    |    |    |     |     |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.16 (b)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    | 0  | 0  |    |    |    |    |    |    |     |     |     |     |     |     |     |
| D3  |    |    |    | 0  | 0  | 0  | 0  | 0  | 0  | 0   |     |     |     |     |     |     |
| D4  |    |    |    |    |    |    |    |    |    |     |     |     |     |     |     |     |
| D5  |    |    |    |    |    |    |    |    |    |     |     |     |     |     |     |     |
| D6  |    |    |    |    |    |    |    |    |    |     |     |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.16 (c)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    | 0  |    |    |    |    |    |    |    |     |     |     |     |     |     |     |
| D3  |    |    | 0  |    |    |    |    |    |    |     |     |     |     |     |     |     |
| D4  |    |    |    | 0  | 0  | 0  | 0  | 0  | 0  | 0   |     |     |     |     |     |     |
| D5  |    |    |    |    |    |    |    |    |    |     |     |     |     |     |     |     |
| D6  |    |    |    |    |    |    |    |    |    |     |     |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.16 (d)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    | 0  |    |    |    |    |    |    |    |     |     |     |     |     |     |     |
| D3  |    |    | 0  |    |    |    |    |    |    |     |     |     |     |     |     |     |
| D4  |    |    |    | 0  |    |    |    |    |    |     |     |     |     |     |     |     |
| D5  |    |    |    |    |    | 0  | 0  | 0  | 0  | 0   | 0   |     |     |     |     |     |
| D6  |    |    |    |    |    |    |    |    |    |     |     |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.16 (e)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    |    | 0  |    |    |    |    |    |    |     |     |     |     |     |     |     |
| D3  |    |    |    | 0  |    |    |    |    |    |     |     |     |     |     |     |     |
| D4  |    |    |    |    | 0  |    |    |    |    |     |     |     |     |     |     |     |
| D5  |    |    |    |    |    | 0  |    |    |    |     |     |     |     |     |     |     |
| D6  |    |    |    |    |    |    | 0  | 0  | 0  | 0   | 0   |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.16 (f)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    |    | 0  |    |    |    |    |    |    |     |     |     |     |     |     |     |
| D3  |    |    |    | 0  |    |    |    |    |    |     |     |     |     |     |     |     |
| D4  |    |    |    |    | 0  |    |    |    |    |     |     |     |     |     |     |     |
| D5  |    |    |    |    |    | 0  |    |    |    |     |     |     |     |     |     |     |
| D6  |    |    |    |    |    |    |    | 0  | 0  | 0   | 0   |     |     |     |     |     |
| D7  |    |    |    |    |    |    |    |    |    |     |     | 0   |     |     |     |     |
| D8  |    |    |    |    |    |    |    |    |    |     |     |     |     |     |     |     |

FIG.16 (g)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    | 0  |    |    |    |    |    |    |    |     |     |     |     |     |     |     |
| D3  |    |    | 0  |    |    |    |    |    |    |     |     |     |     |     |     |     |
| D4  |    |    |    |    | 0  |    |    |    |    |     |     |     |     |     |     |     |
| D5  |    |    |    |    | 0  |    |    |    |    |     |     |     |     |     |     |     |
| D6  |    |    |    |    |    | 0  |    |    |    |     |     |     |     |     |     |     |
| D7  |    |    |    |    |    |    | 0  |    |    |     |     |     |     |     |     |     |
| D8  |    |    |    |    |    |    |    |    |    | 0   | 0   | 0   |     |     |     |     |

FIG.16 (h)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    | O  |    |    |    |    |    |    |    |     |     |     |     |     |     |     |
| D2 |    |    | O  |    |    |    |    |    |    |     |     |     |     |     |     |     |
| D3 |    |    |    | O  |    |    |    |    |    |     |     |     |     |     |     |     |
| D4 |    |    |    |    | O  |    |    |    |    |     |     |     |     |     |     |     |
| D5 |    |    |    |    |    | O  |    |    |    |     |     |     |     |     |     |     |
| D6 |    |    |    |    |    |    | O  |    |    |     |     |     |     |     |     |     |
| D7 |    |    |    |    |    |    |    | O  |    |     |     |     |     |     |     |     |
| D8 |    |    |    |    |    |    |    |    | O  | O   |     |     |     |     |     |     |

FIG.17 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    |    |    |    |    |     |     |     |     |     |     |     |
| D3 |    |    |    |    | O  |    | O  |    | O  |     |     |     |     |     |     |     |
| D4 |    |    |    |    |    |    |    |    |    |     |     |     |     |     |     |     |
| D5 |    |    |    |    | O  |    | O  |    | O  |     |     |     |     |     |     |     |
| D6 |    |    |    |    |    |    |    |    |    |     |     |     |     |     |     |     |
| D7 |    |    |    |    | O  |    | O  |    | O  |     |     |     |     |     |     |     |
| D8 |    |    |    |    |    |    |    |    |    |     |     |     |     |     |     |     |

FIG.17 (b)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | 0 | 0 | | | | | | | | | | | | | |
| D3 | | 0 | 0 | | | | | | | | | | | | | |
| D4 | | 0 | 0 | | | | | | | | 0 | 0 | 0 | 0 | 0 | |
| D5 | | 0 | 0 | | | | | | | | 0 | 0 | 0 | 0 | 0 | |
| D6 | | 0 | 0 | | | | | | | | | | | | | |
| D7 | | | | | | | | | | | | | | | | |
| D8 | | | | | | | | | | | | | | | | |

FIG.18 (a)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | 0 | 0 | | | | | | | | | | | | | |
| D3 | | 0 | 0 | | | | | | | | | 0 | 0 | | | |
| D4 | | 0 | 0 | | | | | | | 0 | 0 | | | | 0 | 0 |
| D5 | | | | 0 | | | | | | 0 | 0 | | | | 0 | 0 |
| D6 | | | | 0 | | | | | | | | | | | | |
| D7 | | 0 | 0 | | | | | | | | | | | | | |
| D8 | | | | | | | | | | | | | | | | |

FIG.18 (b)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | | | | | | | | | | | | | |
| D2 | | 0 | 0 | | | | | | | | 0 | | | | | |
| D3 | 0 | | | | | | | | | | | 0 | | | | |
| D4 | | 0 | 0 | | | | | | | | | | 0 | 0 | 0 | 0 |
| D5 | | | | 0 | | | | | | | | | 0 | 0 | 0 | 0 |
| D6 | | 0 | 0 | | | | | | | | | | | | | |
| D7 | | | | | | | | | | | | | | | | |
| D8 | | 0 | 0 | | | | | | | | | | | | | |

FIG.18 (c)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | 0 | 0 | | | | | | | | | | | | | |
| D2 | | 0 | 0 | | | | | | | | 0 | | 0 | | 0 | |
| D3 | | 0 | 0 | | | | | | | 0 | | 0 | | 0 | | 0 |
| D4 | 0 | | | | | | | | | | 0 | | 0 | | 0 | |
| D5 | 0 | | | | | | | | | | | | | | | |
| D6 | 0 | | | | | | | | | | | | | | | |
| D7 | 0 | | | | | | | | | | | | | | | |
| D8 | | | | | | | | | | | | | | | | |

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | 0 | | | | | | | | | | | | | |
| D2 | 0 | | | | | | | | | | | | | | | |
| D3 | | | 0 | | | | | | | 0 | 0 | 0 | | | | |
| D4 | | 0 | | | | | | | 0 | | | | | | | |
| D5 | | | 0 | 0 | | | | | | 0 | 0 | 0 | | | | |
| D6 | | | 0 | 0 | | | | | | | | | 0 | 0 | 0 | |
| D7 | | | 0 | 0 | | | | | | | | | | | | |
| D8 | | | | | | | | | | | | | | | | |

FIG. 18 (f)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | 0 | | | | | | | | | | | | 0 | 0 |
| D2 | | 0 | | 0 | | | | | | | | | | 0 | | |
| D3 | 0 | | | | 0 | | | | | | 0 | 0 | 0 | | | |
| D4 | | 0 | | 0 | | | | | | | 0 | 0 | 0 | | | |
| D5 | | 0 | | | | | | | 0 | | | | | | | |
| D6 | | 0 | | | | | | | | | | | | | | |
| D7 | | 0 | | | | | | | | | | | | | | |
| D8 | | | | | | | | | | | | | | | | |

FIG. 18 (g)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | | | 0 | 0 | | | | | | | | | | | |
| D2 | | | | 0 | 0 | | | | | | 0 | 0 | | | | |
| D3 | | | | 0 | 0 | | | | | | 0 | 0 | | | | |
| D4 | | 0 | | | | | | | 0 | | | | 0 | | | |
| D5 | | 0 | | | | | | | | | | | | 0 | | |
| D6 | 0 | | | | | | | | | | | | | 0 | | |
| D7 | | | | 0 | | | | | | | | | | | 0 | 0 |
| D8 | | | | | | | | | | | | | | | | |

FIG. 18 (h)

| | S1 | S2 | S3 | S4 | S5 | S6 | S7 | S8 | S9 | S10 | S11 | S12 | S13 | S14 | S15 | S16 |
|---|---|---|---|---|---|---|---|---|---|---|---|---|---|---|---|---|
| D1 | | 0 | 0 | | | | | | 0 | 0 | | | | | | |
| D2 | | 0 | 0 | | | | | | 0 | 0 | | | | | | |
| D3 | 0 | | | | | | | | | | 0 | 0 | 0 | 0 | 0 | 0 |
| D4 | 0 | | | | | | | | | | | | | | | |
| D5 | 0 | | | | | | | | | | | | | | | |
| D6 | 0 | | | | | | | | | | | | | | | |
| D7 | 0 | | | | | | | | | | | | | | | |
| D8 | 0 | | | | | | | | | | | | | | | |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  | 0  |    |    |    |     |     |     |     |     |     |     |
| D2 |    |    |    |    | 0  | 0  |    |    |    |     |     |     |     |     |     |     |
| D3 |    |    |    | 0  |    |    |    |    |    | 0   | 0   | 0   |     |     |     |     |
| D4 |    | 0  |    |    |    |    |    | 0  | 0  |     |     |     |     |     |     |     |
| D5 |    | 0  |    |    |    |    |    | 0  | 0  |     |     |     |     |     |     |     |
| D6 |    | 0  |    |    |    |    |    |    |    |     |     |     |     | 0   | 0   | 0   |
| D7 |    | 0  |    |    |    |    |    |    |    |     |     |     |     |     |     |     |
| D8 |    | 0  |    |    |    |    |    |    |    |     |     |     |     |     |     |     |

FIG.19 (a)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  | 0  |    |    |    |     |     |     |     |     |     |     |
| D2 |    |    |    |    | 0  | 0  |    |    |    |     |     |     |     |     |     |     |
| D3 |    |    |    | 0  |    |    |    |    |    |     |     |     |     |     |     |     |
| D4 |    |    |    | 0  |    |    |    |    |    |     |     |     | 0   |     |     | 0   |
| D5 | 0  |    |    |    |    |    |    |    |    |     |     | 0   |     |     |     |     |
| D6 |    | 0  |    |    |    |    |    | 0  | 0  |     |     |     |     |     |     |     |
| D7 |    | 0  |    |    |    |    |    |    |    |     | 0   |     |     | 0   | 0   |     |
| D8 |    | 0  |    |    |    |    |    | 0  | 0  |     |     |     |     |     |     |     |

FIG.19 (b)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    | 0  | 0  |    |    |     |     |     |     |     |     |     |
| D2 |    |    |    |    |    | 0  | 0  |    |    |     |     |     |     |     |     |     |
| D3 |    |    |    |    | 0  |    |    |    |    |     |     |     | 0   | 0   | 0   |     |
| D4 |    |    |    | 0  |    |    |    |    |    |     |     | 0   |     |     |     |     |
| D5 |    |    | 0  |    |    |    |    |    |    |     | 0   |     |     |     |     |     |
| D6 |    | 0  |    |    |    |    |    |    |    | 0   |     |     |     |     |     |     |
| D7 |    | 0  |    |    |    |    |    | 0  | 0  |     |     |     |     |     |     |     |
| D8 |    | 0  |    |    |    |    |    | 0  | 0  |     |     |     |     |     |     |     |

FIG.19 (c)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    | 0  | 0  |    |    |     |     |     |     |     |     |     |
| D2 |    |    |    |    |    | 0  | 0  |    |    |     |     |     |     | 0   | 0   |     |
| D3 |    |    |    |    | 0  |    |    |    |    |     |     |     | 0   |     |     |     |
| D4 |    |    |    | 0  |    |    |    |    |    |     |     | 0   |     |     |     |     |
| D5 |    |    | 0  |    |    |    |    |    |    |     | 0   |     |     |     |     |     |
| D6 |    | 0  |    |    |    |    |    |    |    | 0   |     |     |     |     |     |     |
| D7 | 0  |    |    |    |    |    |    | 0  | 0  |     |     |     |     |     |     |     |
| D8 | 0  |    |    |    |    |    |    | 0  | 0  |     |     |     |     |     |     |     |

FIG.19 (d)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     | 0   |     |     |     |     |     |
| D2 |    |    |    |    |    |    |    |    |    | 0   |     |     |     |     |     |     |
| D3 |    |    |    |    |    |    |    |    | 0  |     |     |     |     |     |     |     |
| D4 |    |    |    |    | 0  |    | 0  |    |    |     |     |     |     |     |     |     |
| D5 |    |    |    |    |    | 0  |    | 0  |    |     |     |     |     |     |     |     |
| D6 |    |    |    |    | 0  |    |    |    |    |     |     |     |     |     |     |     |
| D7 |    |    |    | 0  |    |    |    |    |    |     |     |     |     |     |     |     |
| D8 |    |    | 0  |    |    |    |    |    |    |     |     |     |     |     |     |     |

FIG.19 (e)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    | 0  |    |    |    |    |     |     |     |     |     |     |     |
| D2 |    |    |    | 0  |    | 0  |    |    |    |     |     |     |     |     |     |     |
| D3 |    |    |    |    | 0  |    |    |    |    |     |     |     |     |     |     |     |
| D4 |    |    |    |    |    |    |    | 0  |    |     |     |     |     |     |     |     |
| D5 |    |    |    |    |    |    | 0  |    | 0  |     |     |     |     |     |     |     |
| D6 |    |    |    |    |    |    |    | 0  |    |     |     |     |     |     |     |     |
| D7 |    |    |    |    |    |    |    | 0  |    |     |     |     |     |     |     |     |
| D8 |    |    |    |    |    |    |    | 0  |    |     |     |     |     |     |     |     |

FIG.19 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    |    |    |    |    |     |     |     |     |     |     |     |
| D2 |    |    | 0  |    | 0  |    |    |    |    |     |     |     |     |     |     |     |
| D3 |    |    |    | 0  |    |    |    |    |    |     |     |     |     |     |     |     |
| D4 |    |    |    |    |    |    |    | 0  |    |     |     |     |     |     |     |     |
| D5 |    |    |    |    |    | 0  |    |    | 0  |     |     |     |     |     |     |     |
| D6 |    |    |    |    |    |    |    | 0  |    |     |     |     |     |     |     |     |
| D7 |    |    |    |    |    |    |    |    |    | 0   |     |     |     |     |     |     |
| D8 |    |    |    |    |    |    |    |    |    | 0   |     |     |     |     |     |     |

FIG.19 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | 0  |    |    |    |    |    |     |     |     |     |     |     |     |
| D2 |    |    | 0  |    | 0  |    |    |    |    |     |     |     |     |     |     |     |
| D3 |    |    |    | 0  |    |    |    |    |    |     |     |     |     |     |     |     |
| D4 |    |    |    |    |    |    |    |    | 0  |     |     |     |     |     |     |     |
| D5 |    |    |    |    |    |    | 0  |    |    | 0   |     |     |     |     |     |     |
| D6 |    |    |    |    |    |    |    |    | 0  |     |     |     |     |     |     |     |
| D7 |    |    |    |    |    |    |    |    |    |     | 0   |     |     |     |     |     |
| D8 |    |    |    |    |    |    |    |    |    |     |     | 0   |     |     |     |     |

FIG.19 (h)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    |    |    |    |    |    |    |    |    |     |     |     |     |     |     |     |
| D3  |    |    | O  |    |    |    |    |    |    |     |     |     |     |     |     |     |
| D4  |    | O  |    | O  | O  | O  | O  | O  | O  | O   |     |     |     |     |     |     |
| D5  |    |    |    |    |    |    |    |    |    |     |     |     |     |     |     |     |
| D6  |    |    | O  |    |    |    |    |    |    |     |     |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.20 (a)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    |    |    |     |     |     |     |     |     |     |
| D2  |    |    | O  |    |    |    |    |    |    |     |     |     |     |     |     |     |
| D3  |    | O  |    |    | O  |    |    |    |    |     |     |     |     |     |     |     |
| D4  |    |    |    |    |    |    |    |    |    |     |     |     |     |     |     |     |
| D5  |    |    | O  |    |    |    |    |    |    |     |     |     |     |     |     |     |
| D6  |    |    |    |    |    | O  | O  | O  | O  | O   | O   |     |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.20 (b)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    | O  |    |    |    |    |     |     |     |     |     |     |     |
| D2  |    |    | O  |    |    |    | O  |    |    |     |     |     |     |     |     |     |
| D3  |    |    |    |    | O  |    |    |    |    |     |     |     |     |     |     |     |
| D4  |    |    |    |    |    |    |    |    |    |     |     |     |     |     |     |     |
| D5  |    |    |    |    |    | O  |    |    |    |     |     |     |     |     |     |     |
| D6  |    |    |    |    |    |    |    | O  | O  | O   | O   | O   |     |     |     |     |
| D7  |    |    |    |    |    |    |    |    |    |     |     |     |     |     |     |     |
| D8  |    |    |    |    |    |    |    |    |    |     |     |     |     |     |     |     |

FIG.20 (c)

|     | S1 | S2 | S3 | S4 | S5 | S6 | S7 | S8 | S9 | S10 | S11 | S12 | S13 | S14 | S15 | S16 |
|-----|----|----|----|----|----|----|----|----|----|-----|-----|-----|-----|-----|-----|-----|
| D1  |    |    |    |    |    |    |    | O  |    |     |     |     |     |     |     |     |
| D2  |    |    |    |    |    | O  |    |    | O  |     |     |     |     |     |     |     |
| D3  |    |    |    |    |    |    |    | O  |    |     |     |     |     |     |     |     |
| D4  |    |    |    |    |    |    | O  |    |    | O   |     |     |     |     |     |     |
| D5  |    |    | O  | O  | O  |    |    |    |    |     |     |     |     |     |     |     |
| D6  |    |    |    |    |    |    |    |    |    |     |     |     | O   |     |     |     |
| D7  |    |    |    |    |    |    |    |    |    |     |     |     |     |     |     |     |
| D8  |    |    |    |    |    |    |    |    |    |     |     |     |     |     |     |     |

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    | O  |    |    |    |    |    |    |     |     |     |     |     |     |     |
| D2 |    | O  |    | O  |    |    |    |    |    |     |     |     |     |     |     |     |
| D3 |    |    |    |    | O  |    |    |    |    |     |     |     |     |     |     |     |
| D4 |    |    |    | O  |    |    |    |    |    |     |     |     |     |     |     |     |
| D5 |    |    |    |    |    | O  |    |    |    |     |     |     |     |     |     |     |
| D6 |    |    |    |    |    |    | O  |    | O  |     |     |     |     |     |     |     |
| D7 |    |    |    |    |    |    |    | O  |    | O   |     |     |     |     |     |     |
| D8 |    |    |    |    |    |    |    |    |    |     |     |     |     |     |     |     |

FIG.20 (f)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    | O  |    |    |    |    |    |     |     |     |     |     |     |     |
| D2 |    | O  |    |    | O  |    |    |    |    |     |     |     |     |     |     |     |
| D3 |    |    | O  |    |    | O  |    |    |    |     |     |     |     |     |     |     |
| D4 |    |    |    |    | O  |    |    |    |    |     |     |     |     |     |     |     |
| D5 |    |    |    |    |    |    | O  |    |    |     |     |     |     |     |     |     |
| D6 |    |    |    |    |    |    |    |    | O  |     |     |     |     |     |     |     |
| D7 |    |    |    |    |    |    |    | O  |    |     |     |     |     |     |     |     |
| D8 |    |    |    |    |    |    |    |    |    | O   |     |     |     |     |     |     |

FIG.20 (g)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     |     |     |     |     |     |
| D2 |    |    |    |    |    |    |    |    |    |     |     |     |     |     |     |     |
| D3 |    |    |    |    |    |    |    |    |    |     |     |     |     |     |     |     |
| D4 |    | O  | O  | O  |    | O  | O  | O  | O  | O   |     |     | O   | O   |     |     |
| D5 |    |    |    |    |    |    |    |    |    |     |     |     |     |     |     |     |
| D6 |    |    |    |    |    |    |    |    |    |     |     |     |     |     |     |     |
| D7 |    |    |    |    |    |    |    |    |    |     |     |     |     |     |     |     |
| D8 |    |    |    |    |    |    |    |    |    |     |     |     |     |     |     |     |

FIG.20 (h)

|    | S1 | S2 | S3 | S4 | S5 | S6 | S7 | S8 | S9 | S10 | S11 | S12 | S13 | S14 | S15 | S16 |
|----|----|----|----|----|----|----|----|----|----|-----|-----|-----|-----|-----|-----|-----|
| D1 |    |    |    |    |    |    |    |    |    |     |     | O   |     |     |     |     |
| D2 |    |    |    |    |    |    |    | O  |    |     |     |     |     |     |     |     |
| D3 |    |    |    |    |    |    | O  |    |    |     |     |     |     |     |     |     |
| D4 |    |    |    |    | O  | O  |    |    |    |     |     |     |     |     |     |     |
| D5 |    |    |    |    |    |    |    |    | O  |     |     |     |     |     |     |     |
| D6 |    |    |    |    |    | O  |    |    |    | O   |     |     |     |     |     |     |
| D7 |    |    |    |    |    |    |    |    |    |     |     | O   |     |     |     |     |
| D8 |    |    |    |    |    |    |    |    |    |     |     |     |     | O   |     |     |

FIG. 21

METHOD CAPABLE OF JUDGING VALIDITY OR INVALIDITY OF A STATUS OF SWITCHING ELEMENTS IN A KEYBOARD SWITCH DEVICE

BACKGROUND OF THE INVENTION

This invention relates to a method of detecting the status of a keyboard switch device including a plurality of row conductors, a plurality of column conductors, an the matrix of a plurality of switching elements provided at intersections of the row conductors and the column conductors and operable in response to keyboard operation.

As well known in the art, a keyboard switch device includes a plurality of row conductors, a plurality of column conductors, and the matrix of a plurality of switching elements provided at intersections of the row conductors and the column conductors and operable in response to keyboard operation. In the keyboard switch device of the type described, simultaneous closure of two or more switching elements occurs very often. Such overlapping of closed switching elements is referred to as rollover.

Heretofore, proposals have been made of four methods to deal with the simultaneous closure of the switching elements.

(1) No rollover method
(2) Two-key rollover method
(3) N-key rollover method (hardware type, N represents a positive integer)
(4) Oak's N-key rollover method with detection of a phantom condition (software type)

In the no rollover method, only the first-closed switching element is recognized and provided as valid output data. Once a particular key is pressed, no other keys are recognized until the particular key has been released.

In the two-key rollover method, two keys simultaneously pressed are both recognized. However, if more than two keys are pressed at the same time, only the switching elements corresponding to the first-pressed two keys are recognized and provided as valid output data.

In the N-key rollover method, at most N keys may be pressed simultaneously and each key will be correctly recognized and provided as valid output data. A problem with the N-key rollover method is a so-called phantom closure situation which will shortly be called a phantom condition hereinafter. The phantom condition arises when three switching elements at the three corners of a rectangular pattern are closed in the matrix of the switching elements. In this event, the switching element at the remaining corner of the rectangular pattern is falsely indicated as a closed element although the corresponding key is never pressed actually. One solution to the above-mentioned problem is to use diodes each of which is connected in series to each switching element. Alternatively, Japanese Patent Publication No. 99220/1986 (Tokkai Syô 61-99220) discloses the use of resistors each of which is connected in series to each switching element to isolate the switching elements from one another.

The Oak's N-key rollover method with detection of a phantom condition is disclosed in U.S. Pat. No. 4,420,744. In this method, row conductors and column conductors are scanned to detect the status of each switching element. A result of scanning operation is memorized in an array in a memory unit. The array is checked to determine if any phantom condition exists. After any switching elements in a phantom condition are eliminated, closed switching elements are provided as output data.

In this method, determination of existence of a phantom condition is carried out in a manner which will now be described. A pair of rows in the array are selected. Comparison is made of the information in each column position of the rows to determine if there are two columns where each row indicates a closed switching element. The operation is repeated until all combinations of rows have been selected.

In the above-mentioned methods (1) and (2), the number of the valid data is only one or two. Accordingly, use is restricted to the particular applications in which strict reliability is required.

The method (3) increases the cost of the device because the diodes or the resistors are required. In the latter, a level detection circuit is also necessary in addition to the resistors.

In the method (4), determination of existence of a phantom condition is very much complicated. Furthermore, the output data should be provided after eliminating any switching elements in a phantom condition.

SUMMARY OF THE INVENTION

It is therefore an object of this invention to provide a method of detecting the status of a keyboard switch device, which is capable of judging, on the basis of a simple condition, validity or invalidity of the detected status of the switching elements detected as being closed and which does not require complicated determination of existence of a phantom condition.

It is another object of this invention to provide a method of detecting the status of a keyboard switch device, which facilitates the processing of output data.

According to this invention, there is provided a method of detecting the status of a keyboard switch device including a plurality of row conductors, a plurality of column conductors, and the matrix of a plurality of switching elements provided at intersections of the row conductors and the column conductors and operable in response to keyboard operation, comprising the steps of: a) scanning the row conductors and the column conductors to detect the status of each switching element; b) memorizing a result of scanning operation in a memory unit as memorized information; c) counting, with reference to the memorized information, a closed element total number N representative of a total number of the switching elements detected as being closed; d) counting, with reference to the memorized information, a closed row total number Nr representative of a total number of the row conductors which include the switching elements detected as being closed; e) counting, with reference to the memorized information, a closed column total number Nc representative of a total number of the column conductors which include the switching elements detected as being closed; f) judging whether or not the closed element total number N, the closed row total number Nr, and the closed column total number Nc satisfy a predetermined condition; and g) providing the memorized information as valid data when the predetermined condition is satisfied.

According to this invention, there is also provided a method of detecting the status of a keyboard switch device including a plurality of row conductors, a plurality of column conductors, and the matrix of a plurality of switching elements provided at intersections of the row conductors and the column conductors and operable in response to keyboard operation, comprising the steps of: a) scanning the row conductors and the column conductors to detect the status of each switching element; b) counting, with reference to a result of scanning operation, a closed element total number N representative of a total number of the switching elements detected as being closed; c) counting, with reference to the result of scanning operation, a closed row total number Nr representative of a total number of the row conductors which include the switching elements detected as being closed; d) counting, with reference to the result of scanning operation, a closed column total number Nc representative of a total number of the column conductors which include the switching elements detected as being closed; e) judging whether or not the closed element total number N, the closed row total number Nr, and the closed column total number Nc satisfy a predetermined condition; and f) memorizing the result of scanning operation in a memory unit as valid data when the predetermined condition is satisfied.

Herein, the predetermined condition is defined by either one of the following conditional formulae (1) and (2). Alternatively, the predetermined condition is defined by any one of the following conditional formulae (1) through (4).

$$N=Nr, \quad (1)$$

$$N=Nc, \quad (2)$$

$$N-1=Nr, \quad (3)$$

$$N-1=Nc. \quad (4)$$

In this invention, judgement of validity or invalidity depends upon whether or not the predetermined condition is satisfied by the closed element total number, the closed row total number, and the closed column total number. Accordingly, the judgement is very simple. In addition, the processing of output data is facilitated because the entire information is recognized as invalid unless the predetermined condition is satisfied.

BRIEF DESCRIPTION OF THE DRAWING

FIGS. 5(a)-5(f) show examples of a detected pattern when a closed element total number is equal to 4;

FIGS. 6(a)-6(h) show examples of a detected pattern when a closed element total number is equal to 5;

FIGS. 7(a)-7(g) show examples of a detected pattern when a closed element total number is equal to 6;

FIGS. 8(a)-6(g) show other examples of a detected pattern when a closed element total number is equal to 6;

FIGS. 9(a)-9(h) show examples of a detected pattern when a closed element total number is equal to 7;

FIGS. 10(a)-10(h) show other examples of a detected pattern when a closed element total number is equal to 7;

FIGS. 11 (a)-11(h) show examples of a detected pattern when a closed element total number is equal to 8;

FIGS. 12(a)-12(h) show other examples of a detected pattern when a closed element total number is equal to 8;

FIGS. 13(a)-13(h) show further examples of a detected pattern when a closed element total number is equal to 8;

FIGS. 14(a)-14(h) show examples of a detected pattern when a closed element total number is equal to 9;

FIGS. 15(a)-15(h) show other examples of a detected pattern when a closed element total number is equal to 9;

FIGS. 16(a)-16(h) show further examples of a detected pattern when a closed element total number is equal to 9;

FIGS. 17(a)-17(b) show still further examples of a detected pattern when a closed element total number is equal to 9;

FIGS. 18(a)-18(h) show examples of a detected pattern when a closed element total number is equal to 10;

FIGS. 19(a)-19(h) show other examples of a detected pattern when a closed element total number is equal to 10;

FIGS. 20(a)-20(h) show further examples of a detected pattern when a closed element total number is equal to 10; and FIG. 21 is a graphical representation of the detected patterns illustrated in FIGS. 5(a) through 20(h).

DESCRIPTION OF THE PREFERRED EMBODIMENTS

Figure 1:
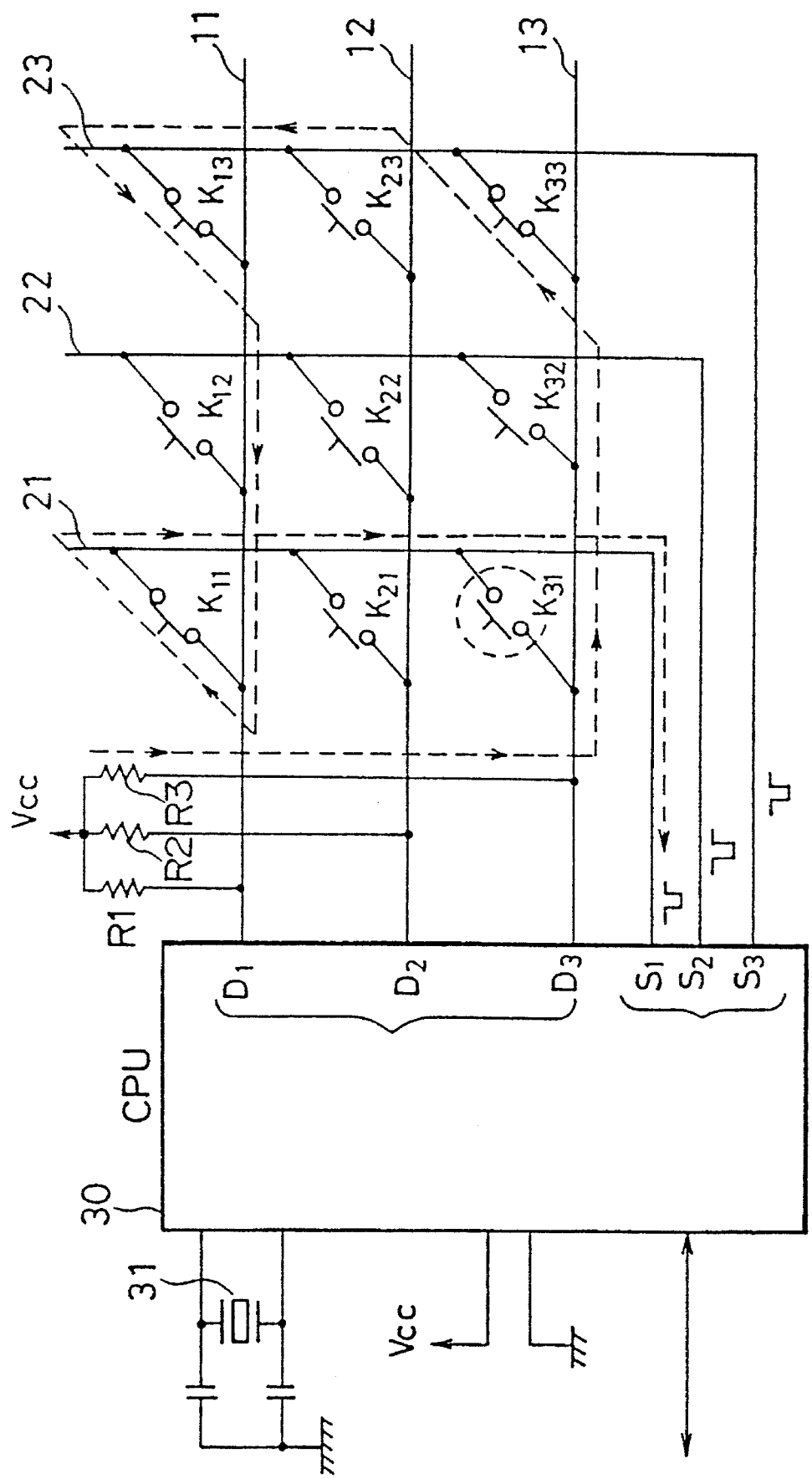
FIG. 1 is a block diagram illustrating a structure of a keyboard switch device to which this invention is applicable.

Description will now be made as regards an embodiment of this invention with reference to the drawing.

FIG. 1 shows a structure of a keyboard switch device to which this invention is applicable. The illustrated keyboard switch device includes first through third row conductors 11, 12, and 13, first through third column conductors 21, 22, and 23, and the matrix of first through ninth switching elements K11, K12, K13, K21, K22, K23, K31, K32, and K33 provided at intersections of the first through the third row conductors 11 through 13 and the first through the third column conductors 21 through 23 and operable in response to keyboard operation.

The first through the third row conductors 11 through 13 and the first through the third column conductors 21 through 23 are connected to a central processing unit (CPU) 30. More specifically, the first through the third row conductors 11 through 13 are connected to first through third key data input ports D1, D2, and D3 of the CPU 30, respectively. The first through the third column conductors 21 through 23 are connected to first through third scanning data output ports S1, S2, and S3 of the CPU 30, respectively. The CPU 30 is supplied with clocks from a quartz oscillator 31. A source voltage Vcc is given to the CPU 30.

At a side near the first through the third key data input ports D1 through D3, the first through the third row conductors 11 through 13 are supplied with the source voltage Vcc via first through third resistors R1, R2, and R3, respectively.

Figures 2, 3:
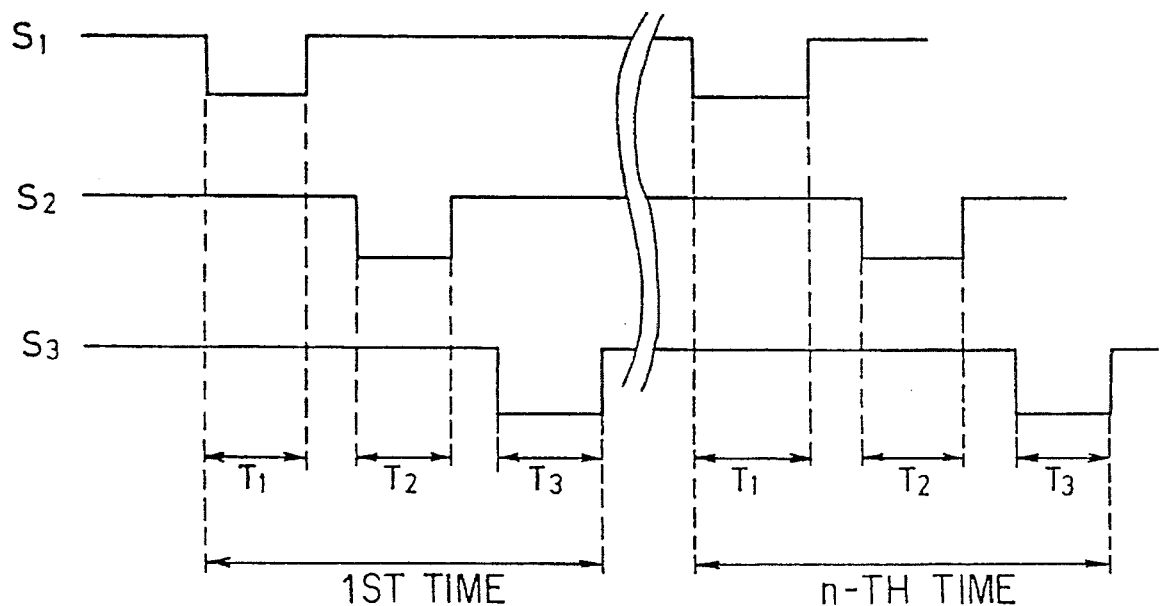
FIG. 2 is a time chart for describing scanning operation by the keyboard switch device illustrated in FIG. 1.
FIG. 3 shows a result of scanning operation by the keyboard switch device illustrated in FIG. 1.

As shown in FIG. 2, the CPU 30 iteratively produces scanning data through the first through the third scanning data output ports S1 through S3 to successively scan the first through the third column conductors 21 through 23. If a closed switching element is detected in a particular row conductor, the particular row conductor is given a logic "0" level representative of presence of the closed switching element. This information is read through the first through the third key data input ports D1 through D3.

As Shown in FIG. 1, it is assumed that the first, the third, and the ninth switching elements K11, K13, and K33 at the three corners of a rectangular pattern in the matrix of the switching elements are actually closed at the same time. Such situation causes the above-mentioned phantom condition. The CPU 30 falsely recognizes the seventh switching element K31 at the remaining corner of the rectangular pattern as being closed, although the corresponding key is not pressed actually. More specifically, the first scanning data output port S1 produces scanning data to scan the first column conductor 21. As shown in a dotted line in FIG. 1, a current flows through the third row conductor 13, the ninth switching element K33, the third column conductor 23, the third switching element K13, the first row conductor 11, the first switching element. 11, and the first column conductor 21. In this event, the third row conductor 13 is given a logic "0" level which is read through the third key data input port D3. Thus, the seventh switching element K31 is falsely recognized as being closed.

FIG. 3 shows a result of scanning operation of the first through the third row conductors 11 through 13 and the first through the third column conductors 21 through 23. This information is memorized in an array in a memory unit (not shown) of the CPU 30. In FIG. 3, a logic "0" level and a logic "1" level represent a closed state and an opened state of each switching element, respectively.

In the above-referenced U.S. Pat. No. 4,420,744, upon detection of existence of a phantom condition, the logic level of the switching element in the phantom condition is reversed from "0" to "1" before providing output key data. In the illustrated example, all of the closed switching elements are involved in creating the phantom condition. Therefore, the information representing that all of the switching elements K11 through K33 are opened is provided as the output key data.

As described above, in a method disclosed in the above-mentioned U.S. Pat. No. 4,420,744, existence of a phantom condition is determined in the following manner. A pair of rows in the array are selected. Comparison is made of the information in each column position of the rows to determine if there are two columns where each row indicates a closed switching element. The operation is repeated until all combinations of rows have been selected. Thus, this method is very much complicated. In addition, the logic levels of the switching elements in the phantom condition must be reversed before the output key data are provided.

This invention does not require such complicated operation of determining existence of a phantom condition. Furthermore, it is unnecessary to reverse the logic levels of the switching elements in the phantom condition. As will later be described in detail, judgement is made in this invention on the basis of a simple condition. When the condition is satisfied, the information is recognized as valid. When the condition is not satisfied, the entire information is recognized as invalid. Thus, neither the complicated determination nor the level reversing operation is required.

Figure 4:
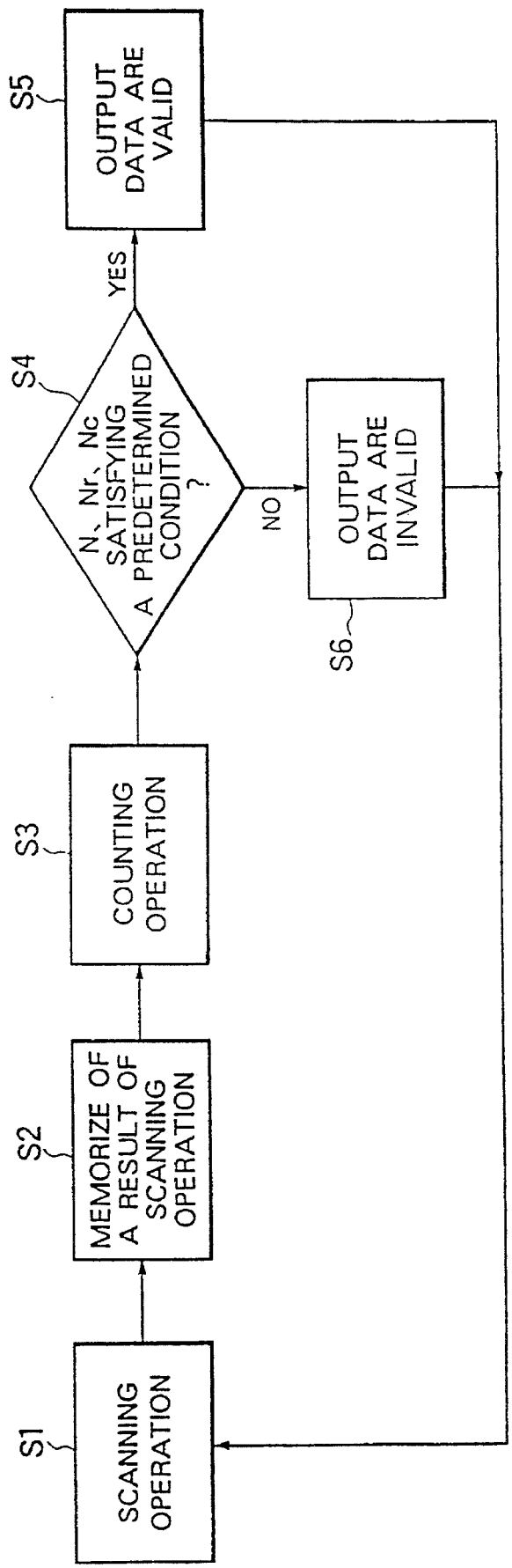
FIG. 4 is a flow chart for describing a method of detecting the status of a keyboard switch device according to one embodiment of this invention.

Referring to FIG. 4, description will be made as regards a method of detecting the status of a keyboard switch device according to one embodiment of this invention.

In a step S1, row conductors and column conductors are scanned to detect the status of each switching element. In a step S2, a result of scanning operation is memorized in an array in a memory unit as memorized information. In a step S3, counting operation is carried out, with reference to the memorized information, for the switching element detected as being closed.

More specifically, the step S3 comprises first through third substeps which will now be described. The first substep is for counting, with reference to the memorized information, a closed switching element total number N representative of a total number of the switching elements detected as being closed. A second substep is for counting, with reference to the memorized information, a closed row total number Nr representative of a total number of the row conductors which include the switching elements detected as being closed. The third substep is for counting, with reference to the memorized information, a closed column total number Nc representative of a total number of the column conductors including the switching elements detected as being closed.

In a step S4, judgement is made as regards whether or not the closed element total number N, the closed row total number Nr, and the closed column total number Nc satisfy a predetermined condition which will later be described. When the predetermined condition is satisfied, the memorized information is provided as valid output data in a step S5. When the predetermined condition is not satisfied, the memorized information is entirely recognized as invalid or cancelled in a step S6. After the step S5 or S6, the operation returns to the step S1.

In this embodiment, the predetermined condition is represented by either one of the following conditional formulae (1) and (2):

$$N = Nr, \text{ and} \tag{1}$$

$$N = Nc. \tag{2}$$

A set of the conditions defined by the conditional formulae (1) and (2) is hereinafter called a first conditional group. In place of the first conditional group, the predetermined condition may be defined by a set of the first conditional group and another condition represented by either one of the following conditional formulae (3) and (4):

$$N-1 = Nr, \text{ and} \tag{3}$$

$$N-1 = Nc. \tag{4}$$

A set of the conditions represented by the conditional formulae (3) and (4) is hereinafter called a second conditional group.

Referring to FIGS. 5(a) through 20(h), description will proceed to the first and the second conditional groups for use in judgement of validity or invalidity of the information.

It is assumed here that the number of the row conductors and the number of the column conductors are equal to eight and sixteen, respectively. The eight row conductors correspond to first through eighth input ports D1 through D8, respectively, while the sixteen column conductors correspond to first through sixteenth output ports S1 through S16. The detected status of the switching elements at intersections of the row conductors and the column conductors is represented by a logic "0" level and a blank when the switching element is closed and opened, respectively. When a closed element total number N representative of a total number of the switching elements detected as being closed is not greater than three, no phantom condition exists. At this time, the first conditional group is always satisfied. Inasmuch as an operator has ten fingers, the maximum number of the keys which can be simultaneously pressed is equal to ten. Accordingly, consideration will be made as regards the cases where the closed element total number N is between four and ten.

FIG. 5(a)–5(f) show examples in case where the closed element total number N is equal to four.

In FIG. 5(a), Nr=Nc=2. In this case, neither the first conditional group nor the second conditional group is satisfied. Accordingly, the information is invalid. In fact, this case shows a phantom condition.

In FIG. 5(b), Nr=1 and Nc=4 in the upper left hand region while Nr=4 and Nc=1 in the lower righthand region. In these cases, the first conditional group, namely, N=Nc or N=Nr is satisfied. Accordingly, the information is valid.

In FIG. 5(c), Nr=Nc=3. In this case, the second conditional group, namely, Nr=N−1 is satisfied. Accordingly, the information is valid.

In FIG. 5(d), Nr=4 and Nc=2 in the lefthand two regions while Nr=2 and Nc=4 in the righthand two regions. In these cases, the first conditional group is satisfied. Accordingly, the information is valid.

In FIG. 5(e), Nr=4 and Nc=3 in the lefthand region while Nr=3 and Nc=4 in the righthand region. In these cases, the first conditional group is satisfied. Accordingly, the information is valid.

In FIG. 5(f), Nr=Nc=4. In this case, the first conditional group is satisfied. Accordingly, the information is valid.

Thus, the judgement is quite identical with the above-described Oak's method when N=4.

FIG. 6(a)–6(h) show examples in case where N=5.

In FIG. 6(a), Nr=5 and Nc=3 in the lefthand region while Nr=3 and Nc=5 in the righthand region. In these cases, the first conditional group is satisfied. Accordingly, the information is valid.

In FIG. 6(b), Nr=5 and Nc=4 in the lefthand region while Nr=4 and Nc=5 in the righthand region. In these cases, the first conditional group is satisfied. Accordingly, the information is valid.

In FIG. 6(c), Nr=Nc=5. In this case, the first conditional group is satisfied. Accordingly, the information is valid.

In FIG. 6(d), Nr=Nc=4. In this case, the second conditional group is satisfied. Accordingly, the information is valid.

In FIG. 6(e), Nr=Nc=3 both in the lefthand and the righthand regions. In these cases, neither the first conditional group nor the second conditional group is satisfied. Accordingly, the information is invalid. In fact, these cases show a phantom condition.

In FIG. 6(f), Nr=4 and Nc=3 in the lefthand region while Nr=3 and Nc=4 in the righthand region. In these cases, the second conditional group is satisfied. Accordingly, the information is valid.

In FIG. 6(g), Nr=5 and Nc=1 in the lefthand region while Nr=1 and Nc=5 in the righthand region. In these cases, the first conditional group is satisfied. Accordingly, the information is valid.

In FIG. 6(h), Nr=5 and Nc=2 in the lefthand two regions while Nr=2 and Nc=5 in the righthand two regions. In these cases, the first conditional group is satisfied. Accordingly, the information is valid.

FIGS. 7(a)–7(g) and 8(a)–8(g) show examples in case where N=6.

In FIG. 7(a), Nr=1 and Nc=6 in the lefthand region while Nr=6 and Nc=1 in the righthand region. In these cases, the first conditional group is satisfied. Accordingly, the information is valid.

In FIG. 7(b), Nr=6 and Nc=2 in the lefthand three regions while Nr=2 and Nc=6 in the righthand three regions. In these cases, the first conditional group is satisfied. Accordingly, the information is valid.

In FIG. 7(c), Nr=6 and Nc=3 in the lefthand two regions while Nr=3 and Nc=6 in the righthand two regions. In these cases, the first conditional group is satisfied. Accordingly, the information is valid.

In FIG. 7(d), Nr=6 and Nc=4 in the lefthand two regions while Nr=4 and Nc=6 in the righthand two regions. In these cases, the first conditional group is satisfied. Accordingly, the information is valid.

In FIG. 7(e), Nr=3 and Nc=2 in the lefthand region while Nr=2 and Nc=3 in the righthand region. In these cases, neither the first conditional group nor the second conditional group is satisfied. Accordingly, the information is invalid. In fact, these cases show a phantom condition.

In FIG. 7(f), Nr=4 and Nc=3 in the lefthand region while Nr=3 and Nc=4 in the righthand region. In these cases, neither the first conditional group nor the second conditional group is satisfied. Accordingly, the information is invalid. In fact, these cases show a phantom condition.

In FIG. 7(g), Nr=Nc=4 both in the lefthand and the righthand regions. In these cases, neither the first conditional group nor the second conditional group is satisfied. Accordingly, the information is invalid. In fact, these cases show a phantom condition.

In FIG. 8(a), Nr=6 and Nc=5 in the lefthand region while Nr=5 and Nc=6 in the righthand region. In these cases, the first conditional group is satisfied. Accordingly, the information is valid.

In FIG. 8(b), Nr=Nc=6. In this case, the first conditional group is satisfied. Accordingly, the information is valid.

In FIG. 8(c), Nr=5 and Nc=3 in the lefthand region while Nr=3 and Nc=5 in the righthand region. In these cases, the second conditional group is satisfied. Accordingly, the information is valid.

In FIG. 8(d), Nr=4 and Nc=5 in the lefthand region while Nr=5 and Nc=5 in the righthand region. In these cases, the second conditional group is satisfied. Accordingly, the information is valid.

In FIG. 8(e), Nr=Nc=5 both in the lefthand and the righthand regions. In these cases, the second conditional group is satisfied. Accordingly, the information is valid.

In FIG. 8(f), Nr=Nc=3. In this case, neither the first conditional group nor the second conditional group is satisfied. Accordingly, the information is invalid. In fact, these cases show a phantom condition.

In FIG. 8(g), Nr=Nc=4. In this case, neither the first conditional group nor the second conditional group is satisfied. Accordingly, the information is judged as being invalid. However, this case does not create a phantom condition. Consideration will later be made as regards other conditions for judging this case as being valid.

FIGS. 9(a)–9(h) and 10(a)–10(h) show examples in case where N=7.

In FIG. 9(a), Nr=1 and Nc=7 in the upper lefthand region while Nr=7 and Nc=1 in the lower righthand region. In these cases, the first conditional group is satisfied. Accordingly, the information is valid.

In FIG. 9(b), Nr=2 and Nc=7 in the lefthand three regions while Nr=7 and Nc=2 in the righthand three regions. In these cases, the first conditional group is satisfied. Accordingly, the information is valid.

In FIG. 9(c), Nr=3 and Nc=7 in the lefthand two regions while Nr=7 and Nc=3 in the righthand three regions. In these cases, the first conditional group is satisfied. Accordingly, the information is valid.

In FIG. 9(d), Nr=4 and Nc=7 in the lefthand region while Nr=7 and Nc=4 in the righthand region. In these cases, the first conditional group is satisfied. Accordingly, the information is valid.

In FIG. 9(e), Nr=3 and Nc=5 in the lefthand region while Nr=5 and Nc=3 in the righthand region. In these cases, neither the first conditional group nor the second conditional group is satisfied. Accordingly, the information is invalid. In fact, these cases show a phantom condition.

In FIG. 9(f), Nr=4 and Nc=5 in the lefthand region while Nr=5 and Nc=4 in the righthand region. In these cases, neither the first conditional group nor the second conditional group is satisfied. Accordingly, the information is invalid. In fact, these cases show a phantom condition.

In FIG. 9(g), Nr=Nc=5 both in the lefthand and the righthand regions. In these cases, neither the first conditional group nor the second conditional group is satisfied. Accordingly, the information is invalid. In fact, these cases show a phantom condition.

In FIG. 9(h), Nr=4 and Nc=3 in the lefthand region while Nr=3 and Nc=4 in the righthand region. In these cases, neither the first conditional group nor the second conditional group is satisfied. Accordingly, the information is invalid. In fact, these cases show a phantom condition.

In FIG. 10(a), Nr=6 and Nc=3 in the lefthand region while Nr=3 and Nc=6 in the righthand region. In these cases, the second conditional group is satisfied. Accordingly, the information is valid.

In FIG. 10(b), Nr=6 and Nc=4 in the lefthand region while Nr=4 and Nc=6 in the righthand region. In these cases, the second conditional group is satisfied. Accordingly, the information is valid.

In FIG. 10(c), Nr=6 and Nc=5 in the lefthand region while Nr=5 and Nc=6 in the righthand region. In these cases, the second conditional group is satisfied. Accordingly, the information is valid.

In FIG. 10(d), Nr=Nc=6 both in the lefthand and the righthand regions. In these cases, the second conditional group is satisfied. Accordingly, the information is valid.

In FIG. 10(e), Nr=5 and Nc=7 in the lefthand region while Nr=7 and Nc=5 in the righthand region. In these cases, the first conditional group is satisfied. Accordingly, the information is valid.

In FIG. 10(f), Nr=6 and Nc=7 in the lefthand region while Nr=7 and Nc=6 in the righthand region. In these cases, the first conditional group is satisfied. Accordingly, the information is valid.

In FIG. 10(g), Nr=Nc=7 both in the lefthand and the righthand regions. In these cases, the first conditional group is satisfied. Accordingly, the information is valid.

In FIG. 10(h), Nr=Nc=5. In this case, neither the first conditional group nor the second conditional group is satisfied. Accordingly, the information is judged as being invalid. However, these cases do not create a phantom condition. Like FIG. 8(g), consideration will later be made as regards other conditions for judging these cases as being valid.

FIGS. 11(a) through 13(h) show examples in case where N= 8.

In FIG. 11(a), Nr=4 and Nc=2 in the lefthand region while Nr=2 and Nc=4 in the righthand region. In these cases, neither the first conditional group nor the second conditional group is satisfied. Accordingly, the information is invalid. In fact, these cases show a phantom condition.

In FIG. 11(b), Nr=5 and Nc=3 in the lefthand region while Nr=3 and Nc=5 in the righthand region. In these cases, neither the first conditional group nor the second conditional group is satisfied. Accordingly, the information is invalid. In fact, these cases show a phantom condition.

In FIG. 11(c), Nr=5 and Nc=4 in the lefthand region while Nr=4 and Nc=5 in the righthand region. In these cases, neither the first conditional group nor the second conditional group is satisfied. Accordingly, the information is invalid. In fact, these cases show a phantom condition.

In FIG. 11(d), Nr=6 and Nc=3 in the lefthand region while Nr=3 and Nc=6 in the righthand region. In these cases, neither the first conditional group nor the second conditional group is satisfied. Accordingly, the information is invalid. In fact, these cases show a phantom condition.

In FIG. 11(e), Nr=6 and Nc=4 in the lefthand region while Nr=4 and Nc=6 in the righthand region. In these cases, neither the first conditional group nor the second conditional group is satisfied. Accordingly, the information is invalid. In fact, these cases show a phantom condition.

In FIG. 11(f), Nr=6 and Nc=5 in the lefthand region while Nr=5 and Nc=6 in the righthand region. In these cases, neither the first conditional group nor the second conditional group is satisfied. Accordingly, the information is invalid. In fact, these cases show a phantom condition.

In FIG. 11(g), Nr=Nc=6 both in the lefthand and the righthand regions. In these cases, neither the first conditional group nor the second conditional group is satisfied. Accordingly, the information is invalid. In fact, these cases show a phantom condition.

In FIG. 11(h), Nr=Nc=8. In this case, the first conditional group is satisfied. Accordingly, the information is valid.

In FIG. 12(a), Nr=Nc=6. In this case, neither the first conditional group nor the second conditional group is satisfied. Accordingly, the information is judged as being invalid. However, this case does not create a phantom condition. Consideration will later be made as regards other conditions for judging this case as being valid.

In FIG. 12(b), Nr=7 and Nc=4 in the lefthand region while Nr=4 and Nc=7 in the righthand region. In these cases, the second conditional group is satisfied. Accordingly, the information is valid.

In FIG. 12(c), Nr=7 and Nc=5 in the lefthand region while Nr=5 and Nc=7 in the righthand region. In these cases, the second conditional group is satisfied. Accordingly, the information is valid.

In FIG. 12(d), Nr=7 and Nc=6 in the lefthand region while Nr=6 and Nc=7 in the righthand region. In these cases, the second conditional group is satisfied. Accordingly, the information is valid.

In FIG. 12(e), Nr=7 and Nc=3 in the lefthand region while Nr=3 and Nc=7 in the righthand region. In these cases, the second conditional group is satisfied. Accordingly, the information is valid.

In FIG. 12(f), Nr=Nc=5 both in the lefthand and the righthand regions. In these cases, neither the first conditional group nor the second conditional group is satisfied. Accordingly, the information is invalid. In fact, these cases show a phantom condition.

In FIG. 12(g), Nr=6 and Nc=4. In this case, neither the first conditional group nor the second conditional group is satisfied. Accordingly, the information is judged as being invalid. However, this case does not create a phantom condition. Like FIG. 8(g), consideration will later be made as regards other conditions for judging this case as being valid.

In FIG. 12(h), Nr=5 and Nc=6. In this case, neither the first conditional group nor the second conditional group is satisfied. Accordingly, the information is judged as being invalid. However, this case does not create a phantom condition. Like FIG. 8(g), consideration will later be made as regards other conditions for judging this case as being valid.

In FIG. 13(a), Nr=Nc=7 both in the lefthand and the righthand regions. In these cases, the second conditional group is satisfied. Accordingly, the information is valid.

In FIG. 13(b), Nr=8 and Nc=1 in the lefthand region while Nr=1 and Nc=8 in the righthand region. In these cases, the first conditional group is satisfied. Accordingly, the information is valid.

In FIG. 13(c), Nr=8 and Nc=2 in the lefthand region while Nr=2 and Nc=8 in the righthand region. In these cases, the first conditional group is satisfied. Accordingly, the information is valid.

In FIG. 13(d), Nr=8 and Nc=3 in the lefthand region while Nr=3 and Nc=8 in the righthand region. In these cases, the first conditional group is satisfied. Accordingly, the information is valid.

In FIG. 13(e), Nr=8 and Nc=4 in the lefthand region while Nr=4 and Nc=8 in the righthand region. In these cases, the first conditional group is satisfied. Accordingly, the information is valid.

In FIG. 13(f), Nr=8 and Nc=5 in the lefthand region while Nr=5 and Nc=8 in the righthand region. In these cases, the first conditional group is satisfied. Accordingly, the information is valid.

In FIG. 13(g), Nr=8 and Nc=6 in the lefthand region while Nr=6 and Nc=8 in the righthand region. In these cases, the first conditional group is satisfied. Accordingly, the information is valid.

In FIG. 13(h), Nr=8 and Nc=7 in the lefthand region while Nr=7 and Nc=8 in the righthand region. In these cases, the first conditional group is satisfied. Accordingly, the information is valid.

FIGS. 14(a) through 17(b) show examples in case where N= 9.

In FIG. 14(a), Nr=5 and Nc=3 in the lefthand region while Nr=3 and Nc=5 in the righthand region. In these cases, neither the first conditional group nor the second conditional group is satisfied. Accordingly, the information is invalid. In fact, these cases show a phantom condition.

In FIG. 14(b), Nr=6 and Nc=3 in the lefthand region while Nr=3 and Nc=6 in the righthand region. In these cases, neither the first conditional group nor the second conditional group is satisfied. Accordingly, the information is invalid. In fact, these cases show a phantom condition.

In FIG. 14(c), Nr=6 and Nc=4 in the lefthand region while Nr=4 and Nc=6 in the righthand region. In these cases, neither the first conditional group nor the second conditional group is satisfied. Accordingly, the information is invalid. In fact, these cases show a phantom condition.

In FIG. 14(d), Nr=6 and Nc=5 in the lefthand region while Nr=5 and Nc=6 in the righthand region. In these cases, neither the first conditional group nor the second conditional group is satisfied. Accordingly, the information is invalid. In fact, these cases show a phantom condition.

In FIG. 14(e), Nr=7 and Nc=3 in the lefthand region while Nr=3 and Nc=7 in the righthand region. In these cases, neither the first conditional group nor the second conditional group is satisfied. Accordingly, the information is invalid. In fact, these cases show a phantom condition.

In FIG. 14(f), Nr=7 and Nc=4 in the lefthand region while Nr=4 and Nc=7 in the righthand region. In these cases, neither the first conditional group nor the second conditional group is satisfied. Accordingly, the information is invalid. In fact, these cases show a phantom condition.

In FIG. 14(g), Nr=7 and Nc=5 in the lefthand region while Nr=5 and Nc=7 in the righthand region. In these cases, neither the first conditional group nor the second conditional group is satisfied. Accordingly, the information is invalid. In fact, these cases show a phantom condition.

In FIG. 14(h), Nr=7 and Nc=6 in the lefthand region while Nr=6 and Nc=7 in the righthand region. In these cases, neither the first conditional group nor the second conditional group is satisfied. Accordingly, the information is invalid. In fact, these cases show a phantom condition.

In FIG. 15(a), Nr=Nc=7. In this case, neither the first conditional group nor the second conditional group is satisfied. Accordingly, the information is invalid. In fact, this case shows a phantom condition.

In FIG. 15(b), Nr=7 and Nc=6. In this case, neither the first conditional group nor the second conditional group is satisfied. Accordingly, the information is judged as being invalid. However, this case does not create a phantom condition.

In FIG. 15(c), Nr=Nc=7. In this case, neither the first conditional group nor the second conditional group is satisfied. Accordingly, the information is judged as being invalid. However, this case does not create a phantom condition.

As regards the examples in FIGS. 15(b) and (c), other additional conditions will later be considered like FIG. 12(a).

In FIG. 15(d), Nr=8 and Nc=4 in the lefthand region while Nr=4 and Nc=8 in the righthand region. In these cases, the second conditional group is satisfied. Accordingly, the information is valid.

In FIG. 15(e), Nr=8 and Nc=3 in the lefthand region while Nr=3 and Nc=8 in the righthand region. In these cases, the second conditional group is satisfied. Accordingly, the information is valid.

In FIG. 15(f), Nr=8 and Nc=5 in the lefthand region while Nr=5 and Nc=8 in the righthand region. In these cases, the second conditional group is satisfied. Accordingly, the information is valid.

In FIG. 15(g), Nr=8 and Nc=6 in the lefthand region while Nr=6 and Nc=8 in the righthand region. In these cases, the second conditional group is satisfied. Accordingly, the information is valid.

In FIG. 15(h), Nr=8 and Nc=7 in the lefthand region while Nr=7 and Nc=8 in the righthand region. In these cases, the second conditional group is satisfied. Accordingly, the information is valid.

In FIG. 16(a), Nr=Nc=8. In this case, the second conditional group is satisfied. Accordingly, the information is valid.

In FIG. 16(b), Nr=1 and Nc=9. In this case, the first conditional group is satisfied. Accordingly, the information is valid.

In FIG. 16(c), Nr=2 and Nc=9. In this case, the first conditional group is satisfied. Accordingly, the information is valid.

In FIG. 16(d), Nr=3 and Nc=9. In this case, the first conditional group is satisfied. Accordingly, the information is valid.

In FIG. 16(e), Nr=4 and Nc=9. In this case, the first conditional group is satisfied. Accordingly, the information is valid.

In FIG. 16(f), Nr=5 and Nc=9. In this case, the first conditional group is satisfied. Accordingly, the information is valid.

In FIG. 16(g), Nr=6 and Nc=9. In this case, the first conditional group is satisfied. Accordingly, the information is valid.

In FIG. 16(h), Nr=7 and Nc=9. In this case, the first conditional group is satisfied. Accordingly, the information is valid.

In FIG. 17(a), Nr=8 and Nc=9. In this case, the first conditional group is satisfied. Accordingly, the information is valid.

In FIG. 17(b), Nr=Nc=3. In this case, neither the first conditional group nor the second conditional group is satisfied. Accordingly, the information is invalid. In fact, this case shows a phantom condition.

FIGS. 18(a) through 20(h) show examples in case where N= 10.

In FIG. 18(a), Nr=5 and Nc=2 in the lefthand region while Nr=2 and Nc=5 in the righthand region. In these cases, neither the first conditional group nor the second conditional group is satisfied. Accordingly, the information is invalid. In fact, these cases show a phantom condition.

In FIG. 18(b), Nr=6 and Nc=3 in the lefthand region while Nr=3 and Nc=6 in the righthand region. In these cases, neither the first conditional group nor the second conditional group is satisfied. Accordingly, the information is invalid. In fact, these cases show a phantom condition.

In FIG. 18(c), Nr=6 and Nc=4 in the lefthand region while Nr=4 and Nc=6 in the righthand region. In these cases, neither the first conditional group nor the second conditional group is satisfied. Accordingly, the information is invalid. In fact, these cases show a phantom condition.

In FIG. 18(d), Nr=7 and Nc=3 in the lefthand region while Nr=3 and Nc=7 in the righthand region. In these cases, neither the first conditional group nor the second conditional group is satisfied. Accordingly, the information is invalid. In fact, these cases show a phantom condition.

In FIG. 18(e), Nr=7 and Nc=4 in the lefthand region while Nr=4 and Nc=7 in the righthand region. In these cases, neither the first conditional group nor the second conditional group is satisfied. Accordingly, the information is invalid. In fact, these cases show a phantom condition.

In FIG. 18(f), Nr=7 and Nc=5 in the lefthand region while Nr=5 and Nc=7 in the righthand region. In these cases, neither the first conditional group nor the second conditional group is satisfied. Accordingly, the information is invalid. In fact, these cases show a phantom condition.

In FIG. 18(g), Nr=7 and Nc=6 in the lefthand region while Nr=6 and Nc=7 in the righthand region. In these cases, neither the first conditional group nor the second conditional group is satisfied. Accordingly, the information is invalid. In fact, these cases show a phantom condition.

In FIG. 18(h), Nr=8 and Nc=3 in the lefthand region while Nr=3 and Nc=8 in the righthand region. In these cases, neither the first conditional group nor the second conditional group is satisfied. Accordingly, the information is invalid. In fact, these cases show a phantom condition.

In FIG. 19(a), Nr=8 and Nc=4 in the lefthand region while Nr=4 and Nc=8 in the righthand region. In these cases, neither the first conditional group nor the second conditional group is satisfied. Accordingly, the information is invalid. In fact, these cases show a phantom condition.

In FIG. 19(b), Nr=8 and Nc=5 in the lefthand region while Nr=5 and Nc=8 in the righthand region. In these cases, neither the first conditional group nor the second conditional group is satisfied. Accordingly, the information is invalid. In fact, these cases show a phantom condition.

In FIG. 19(c), Nr=8 and Nc=6 in the lefthand region while Nr=6 and Nc=8 in the righthand region. In these cases, neither the first conditional group nor the second conditional group is satisfied. Accordingly, the information is invalid. In fact., these cases show a phantom condition.

In FIG. 19(d), Nr=8 and Nc=7 in the lefthand region while Nr=7 and Nc=8 in the righthand region. In these cases, neither the first conditional group nor the second conditional group is satisfied. Accordingly, the information is invalid. In fact, these cases show a phantom condition.

In FIG. 19(e), Nr=Nc=8. In this case, neither the first conditional group nor the second conditional group is satisfied. Accordingly, the information is invalid. In fact, these cases show a phantom condition.

In FIG. 19(f), Nr=8 and Nc=6. In this case, neither the first conditional group nor the second conditional group is satisfied. Accordingly, the information is judged as being invalid. However, this case does not create a phantom condition.

In FIG. 19(g), Nr=8 and Nc=7. In this case, neither the first conditional group nor the second conditional group is satisfied. Accordingly, the information is judged as being invalid. However, this case does not create a phantom condition.

In FIG. 19(h), Nr=Nc=8. In this case, neither the first conditional group nor the second conditional group is satisfied. Accordingly, the information is judged as being invalid. However, this case does not create a phantom condition.

As regards the examples in FIGS. 19(f) through (h), other additional conditions will later be considered like FIG. 12(a).

In FIG. 20(a), Nr=3 and Nc=9. In this case, the second conditional group is satisfied. Accordingly, the information is valid.

In FIG. 20(b), Nr=4 and Nc=9. In this case, the second conditional group s satisfied. Accordingly, the information is valid.

In FIG. 20(c), Nr=5 and Nc=9. In this case, the second conditional group s satisfied. Accordingly, the information s valid.

In FIG. 20(d), Nr=6 and Nc=9. In this case, the second conditional group is satisfied. Accordingly, the information s valid.

In FIG. 20(e), Nr=7 and Nc=9. In this case, the second conditional group s satisfied. Accordingly, the information s valid.

In FIG. 20(f), Nr=8 and Nc=9. In this case, the second conditional group s satisfied. Accordingly, the information is valid.

In FIG. 20(g), Nr=1 and Nc=10. In this case, the first conditional group is satisfied. Accordingly, the information s valid.

In FIG. 20(h), Nr=8 and Nc=10. In this case, the first conditional group is satisfied. Accordingly, the information is valid.

Although not shown in the figure, the first conditional group is satisfied in case where Nc=10 and Nr is between 2 and 7. In this case, the information is valid.

FIG. 21 is a graphical representation of the examples illustrated in FIGS. 5(a) through 20(h). In FIG. 21, the closed element total number N is indicated in a horizontal line (a top row) while a ratio between the closed row total number Nr and the closed column total number Nc is indicated in a vertical line (a leftmost column). It is noted here that a similar result is obtained if the ratio is reversed between Nr and Nc.

In the figure, each double circle represents the case which is judged as being valid because the first conditional group is satisfied. Each single circle represents the case which is judged as being valid because the second conditional group is satisfied. Each cross represents the case which is judged as being invalid because neither the first conditional group nor the second conditional group is satisfied and which is actually invalid. Each triangle represents the case which is judged as being invalid because neither the first conditional group nor the second conditional group is satisfied but which may actually be valid.

It is understood from FIG. 21 that almost all of the actually valid cases can be correctly judged by judging those cases satisfying the first or the second conditional group as being valid. Although all potential cases are not completely covered, the accuracy is satisfactory in practical use.

Next, description will proceed to the remaining cases which are not covered. Those cases are classified into first and second groups. The first group includes the cases shown in FIGS. 8(g), 10(h), 12(g), and 12(h). The second group includes the cases shown in FIGS. 12(a), 15(b), 15(c), 19(f) through 19(h).

In the cases of the first group in common, only one of the column conductors and/or only one of the row conductors include two or more closed switching elements. Such condition is hereinafter referred to as a third conditional group. Accuracy of judgement is improved by the use of the third conditional group in addition to the first and the second conditional groups.

In the cases of the second group in common, two of the column conductors and/or two of the row conductors include two or more closed switching elements. With this condition alone, however, the actually invalid cases may be falsely judged as being valid, as shown in FIG. 19(e). In this connection, addition is made of another condition where any closed switching elements in the different row conductors including two or more closed switching elements exist in a common column conductor or any closed switching elements in the different column conductors including two or more closed switching elements exist in a common row conductor. Such additional condition is herein referred to as a fourth conditional group. Accuracy of judgement is further improved by the use of the fourth conditional group in addition to the first through the third conditional groups.

It is understood from the foregoing description that validity or invalidity can be judged by the first through the fourth conditional groups inasmuch as N is not greater than eight.

Figure 22:
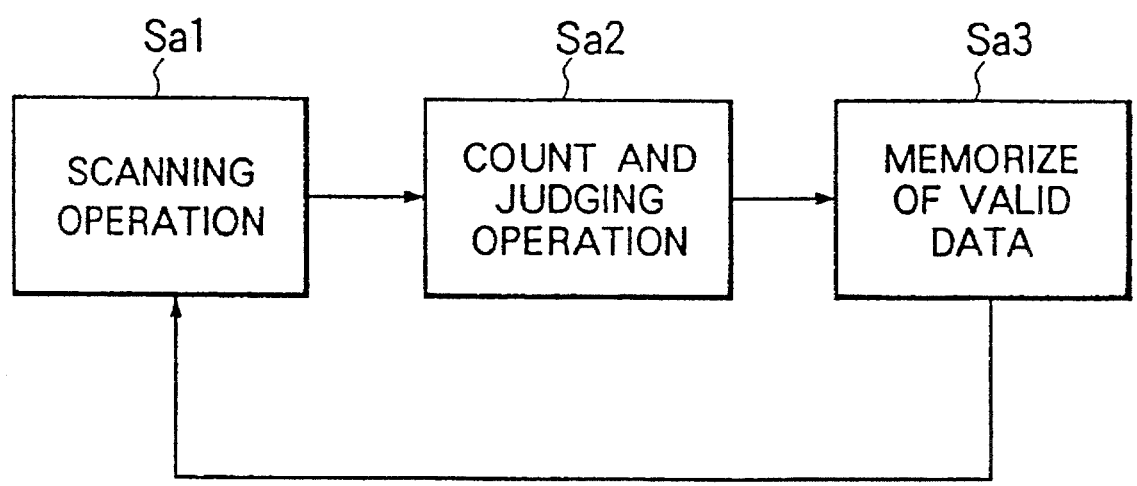
FIG. 22 is a flow chart for describing a method of detecting the status of a keyboard switch device according to another embodiment of this invention.

Referring to FIG. 22, description will be made to a method of detecting the status of the keyboard switch device according to another embodiment of this invention. This embodiment is different from the first-described embodiment in FIG. 4 in the following respect. In FIG. 4, the judgement of condition is carried out after the result of scanning operation is memorized in the memory unit. However, in this embodiment, the result of scanning operation obtained in a step Sa1 is subjected to counting operation and judgement of condition in a step Sa2 corresponding to the steps S3 and S4 in FIG. 4. When the condition is satisfied, the result of scanning operation is memorized or stored as valid data in the memory unit (a step Sa3).

As described, validity or invalidity is judged on the basis 0f whether or not the predetermined condition is satisfied by the closed element total number, the closed row total number, and the closed column total number. Thus, the judgement is very simple. In case where the predetermined condition is not satisfied, the entire data are recognized as invalid or discarded. As a result, the processing of the output data is very simple.

While this invention has thus far been described in conjunction with a few embodiment thereof, it will readily be possible for those skilled in the art to put this invention into practice in various other manners.

What is claimed is:

1. A method of detecting the status of a keyboard switch device including a plurality of row conductors, a plurality of column conductors which intersect said row conductors, and a matrix of a plurality of switching elements respectively provided at said intersections of said row conductors and said column conductors and operable in response to keyboard operation, comprising the steps of:

(a) scanning said row conductors and said column conductors to detect the status of each switching element;

(b) memorizing a result of said scanning operation in a memory unit as memorized information;

(c) counting, with reference to said memorized information, a closed element total number N representative of a total number of the switching elements detected as being closed;

(d) counting, with reference to said memorized information, a closed row total number Nr representative of a total number of the row conductors which include the switching elements detected as being closed;

(e) counting, with reference to said memorized information, a closed column total number Nc representative of a total number of the column conductors which include the switching elements detected as being closed;

(f) judging whether or not said closed element total number N, said closed row total number Nr, and said closed column total number Nc satisfies one of the following formulae (1) and (2):

$$N=Nr, \tag{1}$$

$$N=Nc; \tag{2}$$

and (g) providing said memorized information as valid data accurately representing the status of the keyboard switch device when one of said formulae (1) and (2) is satisfied.

2. The method of claim 1, wherein said steps (a) to (g) are each carried out only once to detect the status of the keyboard switch device.

3. The method of claim 1, further comprising cancelling said memorized information if none of the formulae (1) and (2) are satisfied.

4. The method of claim 3, wherein said steps (a) to (g) are each carried out only once to detect the status of the keyboard switch device.

5. A method of detecting the status of a keyboard switch device including a plurality of row conductors, a plurality of column conductors which intersect said row conductors, and a matrix of a plurality of switching elements respectively provided at said intersections of said row conductors and said column conductors and operable in response to keyboard operation, comprising the steps of:

(a) scanning said row conductors and said column conductors to detect the status of each switching element;

(b) memorizing a result of said scanning operation in a memory unit as memorized information;

(c) counting, with reference to said memorized information, a closed element total number N representative of a total number of the switching elements detected as being closed;

(d) counting, with reference to said memorized information, a closed row total number Nr representative of a total number of the row conductors which include the switching elements detected as being closed;

(e) counting, with reference to said memorized information, a closed column total number Nc representative of a total number of the column conductors which include the switching elements detected as being closed;

(f) judging whether or not said closed element total number N, said closed row total number Nr, and said closed column total number Nc satisfy any one of the following formulae (1) through (4):

$$N=Nr, \tag{1}$$

$$N=Nc, \tag{2}$$

$$N-1=Nr, \quad (3)$$

$$N-1=Nc; \quad (4)$$

and (g) providing said memorized information as valid data accurately representing the status of the keyboard switch device when any one of said formulae (1) through (4) is satisfied.

6. The method of claim 5, wherein said steps (a) to (g) are each carried out only once to detect the status of the keyboard switch device.

7. The method of claim 5, further comprising cancelling said memorized information if none of the formulae (1), (2), (3) and (4) are satisfied.

8. The method of claim 10, wherein said steps (a) to (g) are each carried out only once to detect the status of the keyboard switch device.

9. A method of detecting the status of a keyboard switch device including a plurality of row conductors, a plurality of column conductors which intersects said row conductors, and a matrix of a plurality of switching elements provided at said intersections of said row conductors and said column conductors and operable in response to keyboard operation, comprising the steps of:

(a) scanning said row conductors and said column conductors to detect the status of each switching element;

(b) counting, with reference to a result of said scanning operation, a closed element total number N representative of a total number of the switching elements detected as being closed;

(c) counting, with reference to said result of said scanning operation, a closed row total number Nr representative of a total number of the row conductors which include the switching elements detected as being closed;

(d) counting, with reference to said result of said scanning operation, a closed column total number Nc representative of a total number of the column conductors which include the switching elements detected as being closed;

(e) judging whether or not said closed element total number N, said closed row total number Nr, and said closed column total number Nc satisfies one of the following formulae (1) and (2):

$$N=Nr, \quad (1)$$

$$N=Nc; \quad (2)$$

and (f) memorizing said result of said scanning operation in a memory unit as valid data accurately representing the status of the keyboard switch device when one of said formulae (1) and (2) is satisfied.

10. The method of claim 9, wherein said steps (a) to (f) are each carried out only once to detect the status of the keyboard switch device.

11. The method of claim 9, further comprising cancelling said memorized information if none of the formulae (1) and (2) are satisfied.

12. The method of claim 11, wherein said steps (a) to (f) are each carried out only once to detect the status of the keyboard switch device.

13. A method of detecting the status of a keyboard switch device including a plurality of row conductors, a plurality of column conductors which intersect said row conductors, and a matrix of a plurality of switching elements provided at said intersections of said row conductors and said column conductors and operable in response to keyboard operation, comprising the steps of:

(a) scanning said row conductors and said column conductors to detect the status of each switching element;

(b) counting, with reference to a result of said scanning operation, a closed element total number N representative of a total number of the switching elements detected as being closed;

(c) counting, with reference to said result of said scanning operation, a closed row total number Nr representative of a total number of the row conductors which include the switching elements detected as being closed;

(d) counting, with reference to said result of said scanning operation, a closed column total number Nc representative of a total number of the column conductors which include the switching elements detected as being closed;

(e) judging whether or not said closed element total number N, said closed row total number Nr, and said closed column total number Nc satisfy any one of the following formulae (1) through (4):

$$N=Nr, \quad (1)$$

$$N=Nc, \quad (2)$$

$$N-1=Nr, \quad (3)$$

$$N-1=Nc; \quad (4)$$

and (f) memorizing said result of said scanning operation in a memory unit as valid data accurately representing the status of the keyboard switch device when any one of said formulae (1) through (4) is satisfied.

14. The method of claim 13, wherein said steps (a) to (f) are each carried out only once to detect the status of the keyboard switch device.

15. The method of claim 13, further comprising cancelling said memorized information if none of the formulae (1), (2), (3) and (4) are satisfied.

16. The method of claim 15, wherein said steps (a) to (f) are each carried out only once to detect the status of the keyboard switch device.

* * * * *